(12) United States Patent
Sakaguchi et al.

(10) Patent No.: US 6,417,069 B1
(45) Date of Patent: Jul. 9, 2002

(54) SUBSTRATE PROCESSING METHOD AND MANUFACTURING METHOD, AND ANODIZING APPARATUS

(75) Inventors: Kiyofumi Sakaguchi, Yokohama; Satoshi Matsumura, Atsugi; Kenji Yamagata, Sagamihara, all of (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/532,071

(22) Filed: Mar. 21, 2000

(30) Foreign Application Priority Data

Mar. 25, 1999 (JP) .......................................... 11-082349

(51) Int. Cl.⁷ ............................................. H01L 21/76
(52) U.S. Cl. ...................... 438/408; 438/409; 438/406; 204/237; 204/256; 204/270; 205/221
(58) Field of Search .................................. 438/408, 409, 438/778, 787, 788, 789, 795, 796, 927, 960; 205/206, 213, 328; 204/237, 238, 256, 258, 265, 270, 277, 279, 297.05, 297.13; 427/294

(56) References Cited

U.S. PATENT DOCUMENTS

| | | | | |
|---|---|---|---|---|
| 3,715,288 A | * | 2/1973 | Risgin ........................ 204/38 A |
| 3,902,976 A | * | 9/1975 | Walls ......................... 204/38 A |
| 4,092,445 A | * | 5/1978 | Tsuzuki et al. ................ 427/85 |
| 4,891,103 A | * | 1/1990 | Zorinsky et al. ............. 204/1 T |
| 5,358,600 A | * | 10/1994 | Canham et al. ............. 156/644 |
| 5,371,037 A | | 12/1994 | Yonehara ..................... 437/86 |
| 5,458,735 A | * | 10/1995 | Richter et al. ............ 156/662.1 |
| 5,458,755 A | | 10/1995 | Fujiyama et al. ........... 204/224 |
| 5,650,042 A | * | 7/1997 | Ogura ...................... 156/655.1 |
| 5,856,229 A | | 1/1999 | Sakaguchi et al. .......... 438/406 |
| 5,951,833 A | * | 9/1999 | Yamagata .................... 204/198 |
| 6,121,112 A | * | 9/2000 | Sakaguchi et al. .......... 438/406 |
| 6,200,878 B1 | * | 3/2001 | Yamagata et al. .......... 438/406 |
| 6,214,701 B1 | * | 4/2001 | Matsushita et al. ......... 438/458 |
| 6,287,936 B1 | * | 9/2001 | Perea et al. ................. 438/409 |
| 6,326,280 B1 | * | 12/2001 | Tayanaka .................... 438/409 |

FOREIGN PATENT DOCUMENTS

| | | |
|---|---|---|
| JP | 5-21338 | 1/1993 |
| JP | 6-275598 | 9/1994 |
| JP | 7-302889 | 11/1995 |

OTHER PUBLICATIONS

Imai, et al. "Crystalline Quality of Silicon Layer Formed by FIPOS Technology" *Journal of Crystal Growth*, vol. 63, 1983; pp. 547–553.

Uhlir, Jr., "Electrolytic Shaping of Germanium and Silicon" *The Bell System—Technical Journal*, vol. XXXV, 1956; pp. 333–347.

Unagami, "Formation Mechanism of Porous Silicon Layer by Anodization in HF Solution"*Journal of the Electrochemical Society*, vol. 127, No. 2, 1980; pp. 476–483.

(List continued on next page.)

*Primary Examiner*—Charles Bowers
*Assistant Examiner*—Renzo N. Rocchegiani
(74) *Attorney, Agent, or Firm*—Fitzpatrick, Cella, Harper & Scinto

(57) ABSTRACT

A porous layer is formed on an Si substrate using an anodizing apparatus having a conductive partition inserted between a cathode and an anode. First, the cathode and Si substrate are brought into electrical contact through a first electrolyte, and the conductive partition and Si substrate are brought into electrical contact through a second electrolyte. A current is flowed between the cathode and the anode to form a porous layer on the Si substrate. As the first electrolyte, an electrolyte capable of forming a porous structure on the Si substrate is used. As the second electrolyte, an electrolyte substantially incapable of forming a porous structure on the conductive partition is used.

54 Claims, 6 Drawing Sheets

OTHER PUBLICATIONS

Imai, "A New Dielectric Isolation Method Using Porous Silicon" *Solid State Electronics—An International Journal*, vol. 24, 1980; pp. 159–164.

Holmstrom et al., "Complete Dielectric Isolation by Highly Selective and Self–Stopping Formation of Oxidized Porous Silicon" *Applied Physics Letters*, vol. 42, No. 4, 1983; pp. 386–388.

Nagano et al., "Oxidized Porous Silicon and It's Applications" *The Institute of Electronics Information and Communication Engineers Technical Report*, vol. 79, pp. 49–54, SSD 79–95, 1979.

* cited by examiner

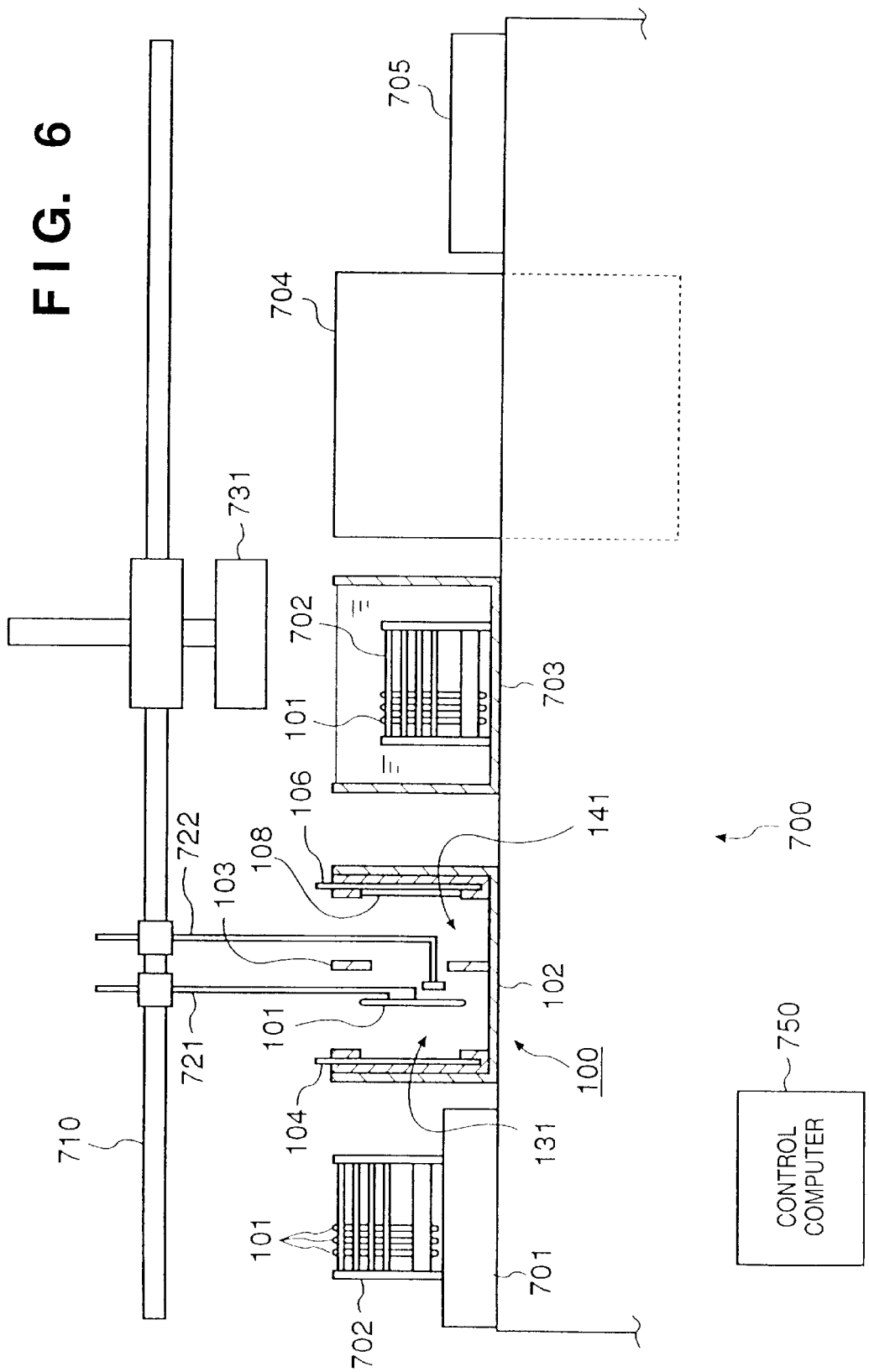

SUBSTRATE PROCESSING METHOD AND MANUFACTURING METHOD, AND ANODIZING APPARATUS

FIELD OF THE INVENTION

The present invention relates to a substrate processing method and manufacturing method, and anodizing apparatus.

BACKGROUND OF THE INVENTION

A substrate (SOI substrate) having an SOI (Silicon On Insulator) structure is known as a substrate having a single-crystal Si layer on an insulating layer. A device using this SOI substrate has many advantages that cannot be achieved by ordinary Si substrates. Examples of the advantages are as follows.

(1) The integration degree can be increased because dielectric isolation is easy.

(2) The radiation resistance can be increased.

(3) The operating speed of the device can be increased because the stray capacitance is small.

(4) No well step is necessary.

(5) Latch-up can be prevented.

(6) A complete depletion type field effect transistor can be formed by thin film formation.

Since an SOI structure has the above various advantages, researches have been made on its formation method for several decades.

As one SOI technology, the SOS (Silicon On Sapphire) technology by which Si is heteroepitaxially grown on a single-crystal sapphire substrate by CVD (Chemical Vapor Deposition) has been known for a long time. This SOS technology once earned a reputation as the most matured SOI technology. However, the SOS technology has not been put into practical use to date because, e.g., a large amount of crystal defects are produced by lattice mismatch in the interface between the Si layer and the underlying sapphire substrate, aluminum that forms the sapphire substrate mixes in the Si layer, the substrate is expensive, and it is difficult to obtain a large area.

Attempts have recently been made to realize the SOI structure without using any sapphire substrate. The attempts are roughly classified into two methods.

In the first method, the surface of a single-crystal Si substrate is oxidized, and a window is formed in the oxide film ($SiO_2$ layer) to partially expose the Si substrate. Single-crystal Si is epitaxially grown laterally using the exposed portion as a seed, thereby forming a single-crystal Si layer on $SiO_2$ (in this method, an Si layer is deposited on an $SiO_2$ layer).

In the second method, a single-crystal Si substrate itself is used as an active layer, and an $SiO_2$ layer is formed under the active layer (in this method, no Si layer is deposited).

As a means for realizing the first method, a method of directly epitaxially growing single-crystal Si in the horizontal direction from the single-crystal Si layer by CVD (CVD), a method of depositing amorphous Si and epitaxially growing single-crystal Si laterally in the solid phase by annealing (solid phase epitaxial growth), a method of irradiating an amorphous silicon layer or a polysilicon layer with a focused energy beam such as an electron beam or laser beam to grow a single-crystal Si layer on an $SiO_2$ layer by melting recrystallization (beam annealing), or a method of scanning band-shaped melting regions by a rod-like heater (zone melting recrystallization) is known.

All of these methods have both advantages and disadvantages and many problems of controllability, productivity, uniformity, and quality, and therefore have not been put into practical use in terms of industrial applications. For example, CVD requires sacrificial oxidation to form a flat thin film. Solid phase epitaxial growth is poor in crystallinity. In beam annealing, the process time required to scan the focused beam and controllability for beam superposition or focal point adjustment pose problems. Zone melting recrystallization is the most matured technique, and relatively large-scaled integrated circuits have been fabricated on a trial basis. However, since a number of crystal defects such as a subboundary undesirably remain, minority carrier devices cannot be created.

As the above second method, i.e., as the method without using the Si substrate as a seed for epitaxial growth, the following four techniques can be used.

As the first technique, an oxide film is formed on a single-crystal Si substrate having a V-shaped groove formed in the surface by anisotropic etching. A polysilicon layer having nearly the same thickness as that of the single-crystal Si substrate is deposited on the oxide film. After this, the single-crystal Si substrate is polished from the back surface, thereby forming, on the thick polysilicon layer, a substrate having a single-crystal Si region surrounded and dielectrically isolated by the V-shaped groove. With this technique, a substrate having satisfactory crystallinity can be formed. However, there are problems of controllability and productivity in association with the process of depositing polysilicon as thick as several hundred micron or the process of polishing the single-crystal Si substrate from the back surface to leave the isolated Si active layer.

The second technique is SIMOX (Separation by Ion Implanted Oxygen). In this technique, oxygen ions are implanted into a single-crystal Si substrate to form an $SiO_2$ layer. In this technique, to form an $SiO_2$ layer in a substrate, oxygen ions must be implanted at a dose of $10^{18}$ (ions/cm$^2$) or more. This implantation takes a long time to result in low productivity and high manufacturing cost. In addition, since a number of crystal defects are generated, the quality is too poor to manufacture minority carrier devices.

As the third technique, an SOI structure is formed by dielectric isolation by oxidizing a porous Si layer. In this technique, an n-type Si island is formed on the surface of a p-type single-crystal Si substrate by proton ion implantation (Imai et al., J. Crystal Growth, vol. 63, 547 (1983)) or epitaxial growth and patterning. This substrate is anodized in an HF solution to convert only the p-type Si substrate around the n-type Si island into a porous structure. After this, the n-type Si island is dielectrically isolated by accelerated oxidation. In this technique, since the Si region to be isolated must be determined before the device process, the degree of freedom in device design is limited.

As the fourth technique, an SOI structure is formed by bonding a single-crystal Si substrate to another thermally oxidized single-crystal Si substrate by annealing or an adhesive. In this technique, an active layer for forming a device must be uniformly thin. More specifically, a single-crystal Si substrate having a thickness of several hundred micron must be thinned down to the micron order or less.

To thin the substrate, polishing or selective etching can be used.

A single-crystal Si substrate can hardly be uniformly thinned by polishing. Especially, in thinning to the submicron order, the variation range is several ten %. As the wafer size becomes large, this difficulty becomes more pronounced.

Selective etching is effective to uniformly thin the substrate. However, the selectivity ratio is as low as about $10^2$, the surface planarity after etching is poor, and the crystallinity of the SOI layer is unsatisfactory.

A transparent substrate represented by a glass substrate is important in forming a contact sensor as a light-receiving element or a projection liquid crystal display device. To realize highly precise pixels (picture elements) having higher density and resolution for the sensor or display device, a high-performance driving element is required. For this purpose, a demand has arisen for a technique of forming a single-crystal Si layer having excellent crystallinity on a transparent substrate.

However, when an Si layer is deposited on a transparent substrate represented by a glass substrate, only an amorphous Si layer or a polysilicon layer is obtained. This is because the transparent substrate has an amorphous crystal structure, and the Si layer formed on the substrate reflects the disorderliness of the crystal structure of the transparent substrate.

The present applicant has disclosed a new SOI technology in Japanese Patent Laid-Open No. 5-21338. In this technique, a first substrate obtained by forming a porous layer on a single-crystal Si substrate and a non-porous single-crystal layer on its surface is bonded to a second substrate via an insulating layer. After this, the bonded substrate stack is separated into two substrates at the porous layer, thereby transferring the non-porous single-crystal layer to the second substrate. This technique is advantageous because the film thickness uniformity of the SOI layer is good, the crystal defect density in the SOI layer can be decreased, the surface planarity of the SOI layer is good, no expensive manufacturing apparatus with special specifications is required, and SOI substrates having about several hundred-Å to 10-$\mu$m thick SOI films can be manufactured by a single manufacturing apparatus.

The present applicant has also disclosed, in Japanese Patent Laid-Open No. 7-302889, a technique of bonding first and second substrates, separating the first substrate from the second substrate without breaking the first substrate, smoothing the surface of the first substrate, forming a porous layer on the first substrate, and reusing the first substrate. Since the first substrate is not wasted, this technique is advantageous in largely reducing the manufacturing cost and simplifying the manufacturing process.

To separate the bonded substrate stack into two substrates without breaking the first and second substrates, for example, the two substrates are pulled in opposite directions while applying a force in a direction perpendicular to the bonding interface, a shearing force is applied parallel to the bonding interface (for example, the two substrates are moved in opposite directions in a plane parallel to the bonding interface, or the two substrates are rotated in opposite directions while applying a force in the circumferential direction), pressure is applied in a direction perpendicular to the bonding interface, a wave energy such as an ultrasonic wave is applied to the separation region, a peeling member (e.g., a sharp blade such as knife) is inserted into the separation region parallel to the bonding interface from the side surface side of the bonded substrate stack, the expansion energy of a substance filling the pores of the porous layer functioning as the separation region is used, the porous layer functioning as the separation region is thermally oxidized from the side surface of the bonded substrate stack to expand the volume of the porous layer and separate the substrates, or the porous layer functioning as the separation region is selectively etched from the side surface of the bonded substrate stack to separate the substrates.

Porous Si was found in 1956 by Uhlir et al. who were studying electropolishing of semiconductors (A. Uhlir, Bell Syst. Tech. J., vol. 35, 333 (1956)). Porous Si can be formed by anodizing an Si substrate in an HF solution.

Unagami et al. studied the dissolution reaction of Si upon anodizing and reported that holes were necessary for anodizing reaction of Si in an HF solution, and the reaction was as follows (T. Unagami, J. Electrochem. Soc., vol. 127, 476 (1980)).

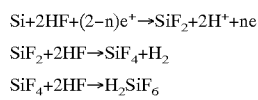

$$Si+2HF+(2-n)e^+ \rightarrow SiF_2+2H^++ne$$
$$SiF_2+2HF \rightarrow SiF_4+H_2$$
$$SiF_4+2HF \rightarrow H_2SiF_6$$

or

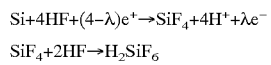

$$Si+4HF+(4-\lambda)e^+ \rightarrow SiF_4+4H^++\lambda e^-$$
$$SiF_4+2HF \rightarrow H_2SiF_6$$

where $e^+$ and $e^-$ represent a hole and an electron, respectively, and n and $\lambda$ are the number of holes necessary to dissolve one Si atom. According to them, when n>2 or $\lambda$>4, porous Si is formed.

The above fact suggests that p-type Si having holes is converted into porous Si while n-type Si is not converted. The selectivity in this conversion has been reported by Nagano et al. and Imai (Nagano, Nakajima, Anno, Onaka, and Kajiwara, IEICE Technical Report, vol. 79, SSD79-9549 (1979)), (K. Imai, Solid-State Electronics, vol. 24, 159 (1981)).

However, it has also been reported that n-type at a high concentration is converted into porous Si (R. P. Holmstrom and J. Y. Chi, Appl. Phys. Lett., vol. 42, 386 (1983)). Hence, it is important to select a substrate which can be converted into a porous Si substrate independently of p- or n-type.

To form a porous layer on an Si substrate, a pair of electrodes are supported in a process tank filled with an HF solution, an Si substrate is held between the electrodes, and a current is flowed between the electrodes. As a problem of this case, the metal elements of the anode dissolve into the HF solution and contaminate the Si substrate.

The present applicant has disclosed an anodizing apparatus for solving this problem in Japanese Patent Laid-Open No. 6-275598. The anodizing apparatus disclosed in Japanese Patent Laid-Open No. 6-275598, a conductive partition formed from an Si material is inserted between an Si substrate and an anode, thereby shielding the Si substrate from contamination by metal elements of the anode.

As in the anodizing apparatus disclosed in Japanese Patent Laid-Open No. 6-275598, when an Si substrate is anodized while keeping the conductive partition of an Si material inserted between the anode and the Si substrate to be processed, a porous structure may be formed not only on the surface of the Si substrate to be processed but also on the surface of the conductive partition depending on the anodizing condition.

To efficiently manufacture substrates, the conductive partition preferably stands a number of times of anodizing. However, when the conductive partition is used for a number of times of anodizing under a condition in which a porous structure is formed on the conductive partition, the porous structure on the surface of the conductive partition grows. Finally, the conductive partition breaks near its surface and generates Si particles. The particles contaminate the Si substrate to be processed and the anodizing tank.

SUMMARY OF THE INVENTION

The present invention has been made in consideration of the above situation, and has as its object to prevent generation of particles from a conductive partition.

According to the first aspect of the present invention, there is provided a substrate processing method of using an anodizing apparatus in which a conductive partition is inserted between a cathode and an anode and electrically connected to the anode, placing a substrate between the cathode and the conductive partition, and forming a porous layer on the substrate by an anodizing reaction, comprising the preparation step of bringing the cathode and a substrate to be processed into electrical contact with each other through a first electrolyte and bringing the conductive partition and the substrate into electrical contact with each other through a second electrolyte, and the anodizing step of flowing a current between the cathode and the anode to form a porous layer on a surface of the substrate on the cathode side, wherein an electrolyte capable of forming a porous structure on the substrate is used as the first electrolyte, and an electrolyte substantially incapable of forming a porous structure on the conductive partition is used as the second electrolyte.

In the substrate processing method according to the first aspect of the present invention, for example, an electrolyte capable of electroetching the conductive partition is preferably used as the second electrolyte.

In the substrate processing method according to the first aspect of the present invention, for example, the conductive partition is preferably formed from the same material as that of the substrate to be processed.

In the substrate processing method according to the first aspect of the present invention, for example, the conductive partition is preferably essentially formed from an Si material In the substrate processing method according to the first aspect of the present invention, for example, the first electrolyte and the second electrolyte are preferably solutions containing hydrogen fluoride.

In the substrate processing method according to the first aspect of the present invention, for example, the first electrolyte and the second electrolyte preferably contain hydrogen fluoride at different concentrations.

In the substrate processing method according to the first aspect of the present invention, for example, the first electrolyte preferably contains hydrogen fluoride at a concentration higher than that in the second electrolyte.

In the substrate processing method according to the first aspect of the present invention, for example, the first electrolyte preferably contains hydrogen fluoride at a concentration of 10% to 50%.

In the substrate processing method according to the first aspect of the present invention, for example, the second electrolyte preferably contains hydrogen fluoride at a concentration of not more than 10%.

In the substrate processing method according to the first aspect of the present invention, for example, the second electrolyte preferably contains hydrogen fluoride at a concentration of not more than 2%.

In the substrate processing method according to the first aspect of the present invention, for example, the current supplied from the anode to the substrate is preferably supplied through the conductive partition.

In the substrate processing method according to the first aspect of the present invention, for example, the anodizing step preferably comprises forming, on the substrate, a porous layer having a multilayered structure formed from at least two layers having different porosities.

In the substrate processing method according to the first aspect of the present invention, for example, the anodizing step preferably comprises changing the magnitude of the current flowed between the cathode and the anode to form the porous layer having the multilayered structure.

In the substrate processing method according to the first aspect of the present invention, for example, the anodizing step preferably comprises replacing the first electrolyte with another electrolyte to form the porous layer having the multilayered structure.

In the substrate processing method according to the first aspect of the present invention, for example, the preparation step preferably comprises the steps of holding the substrate to be processed between the cathode and the anode by a substrate holder, and filling the space between the cathode and the substrate with the first electrolyte and filling the space between the conductive partition and the substrate with the second electrolyte.

The substrate processing method according to the first aspect of the present invention preferably further comprises, e.g., after the porous layer is formed on the substrate to be processed, the steps of discharging the first and second electrolytes, and detaching the substrate from the substrate holder.

In the substrate processing method according to the first aspect of the present invention, for example, the anodizing step preferably comprises forming the porous layer having the multilayered structure such that all or some layers from a second layer counted from a surface of the substrate have porosities higher than a porosity of a first layer counted from the surface of the substrate.

In the substrate processing method according to the first aspect of the present invention, for example, the anodizing step preferably comprises setting the porosity of the first layer at not more than 30% and the porosities of all or some layers from the second layer at not less than 30%.

In the substrate processing method according to the first aspect of the present invention, for example, the anodizing step preferably comprises setting a thickness of the second layer at not more than 5 $\mu$m.

The substrate processing method according to the first aspect of the present invention preferably further comprises, e.g., the cleaning and/or rinsing step of cleaning and/or rinsing the substrate after the porous layer is formed on the substrate to be processed.

The substrate processing method according to the first aspect of the present invention preferably further comprises, e.g., the drying step of drying the substrate cleaned and/or rinsed in the cleaning and/or rinsing step.

According to the second aspect of the present invention, there is provided a substrate processing method of placing a substrate to be processed between a cathode and an anode of an anodizing tank having the cathode and the anode, which is partitioned by the substrate to be processed into a space on the cathode side and a space on the anode side, and forming a porous layer on the substrate by an anodizing reaction, comprising the steps of filling the space on the cathode side of the anodizing tank with a first electrolyte and filling the space on the anode side with a second electrolyte, and flowing a current between the cathode and the anode to form the porous layer on a surface of the substrate on the cathode side, wherein the first electrolyte and the second electrolyte are electrolytes having different properties from the viewpoint of the anodizing reaction.

In the substrate processing method according to the second aspect of the present invention, for example, the anodizing tank preferably has a conductive partition for isolating the substrate to be processed from the anode.

According to the third aspect of the present invention, there is provided an anodizing apparatus for forming a porous layer on a substrate by an anodizing reaction, comprising a cathode, an anode, a substrate holder for holding the substrate to be processed between the cathode and the anode, a conductive partition isolating the substrate from the anode and electrically connected to the anode, a first supply system for supplying a first electrolyte between the cathode and the substrate, a second supply system for supplying a second electrolyte between the conductive partition and the substrate, a first discharge system for discharging the first electrolyte between the cathode and the substrate, a second discharge system for discharging the second electrolyte between the conductive partition and the substrate, and a controller for controlling the first and second supply systems and the first and second discharge systems in accordance with a procedure with which the first electrolyte and the second electrolyte are prevented from mixing each other.

According to the fourth aspect of the present invention, there is provided a substrate manufacturing method comprising the first formation step of forming a porous layer on a surface of a substrate according to any one of the above substrate processing methods, the second formation step of forming a non-porous layer on the porous layer, the bonding step of, using a substrate obtained in the second formation step as a first substrate, bonding the first substrate to an independently prepared second substrate via the non-porous layer to prepare a bonded substrate stack, and the removal step of removing a portion from a back surface of the first substrate to the porous layer from the bonded substrate stack.

According to the fifth aspect of the present invention, there is provided a substrate manufacturing method comprising the first formation step of forming a porous layer on a surface of a substrate according to any one of the above substrate processing methods, the second formation step of forming a non-porous layer on the porous layer, the bonding step of, using a substrate obtained in the second formation step as a first substrate, bonding the first substrate to an independently prepared second substrate via the non-porous layer to prepare a bonded substrate stack, the separation step of separating the bonded substrate stack at the porous layer, and the removal step of removing the porous layer remaining on the second substrate after separation.

In the substrate manufacturing method according to the fifth aspect of the present invention, for example, the separation step preferably comprises injecting a fluid into the porous layer to separate the bonded substrate stack into two substrates.

In the substrate manufacturing method according to the fifth aspect of the present invention, for example, the separation step preferably comprises applying a force to the bonded substrate stack in a direction substantially perpendicular to a surface of the bonded substrate stack to separate the bonded substrate stack into two substrates.

In the substrate manufacturing method according to the fifth aspect of the present invention, for example, the separation step preferably comprises shearing stress to the bonded substrate stack in a planar direction to separate the bonded substrate stack into two substrates.

In the substrate manufacturing method according to the fifth aspect of the present invention, for example, the separation step preferably comprises oxidizing a peripheral portion of the porous layer of the bonded substrate stack to increase a volume, thereby separating the bonded substrate stack into two substrates.

In the substrate manufacturing method according to the fifth aspect of the present invention, for example, a liquid is preferably used as the fluid.

In the substrate manufacturing method according to the fifth aspect of the present invention, for example, a gas is preferably used as the fluid.

The substrate manufacturing method according to the fifth aspect of the present invention preferably further comprises, e.g., removing the porous layer remaining on a surface of the first substrate after separation to enable reuse of the substrate.

In the substrate manufacturing method according to the fifth aspect of the present invention, for example, the first formation step preferably comprises forming a porous layer having a multilayered structure with different porosities.

In the substrate manufacturing method according to the fifth aspect of the present invention, for example, the separation step preferably comprises using, as a separation layer, an inner layer of the porous layer having the multilayered structure.

In the substrate manufacturing method according to the fifth aspect of the present invention, for example, the first formation step preferably comprises forming the porous layer on a surface of an Si substrate.

In the substrate manufacturing method according to the fifth aspect of the present invention, for example, the non-porous layer preferably comprises a semiconductor layer.

In the substrate manufacturing method according to the fifth aspect of the present invention, for example, the non-porous layer preferably comprises a single-crystal Si layer.

In the substrate manufacturing method according to the fifth aspect of the present invention, for example, the non-porous layer preferably comprises a single-crystal Si layer and an insulating layer sequentially from an inside.

In the substrate manufacturing method according to the fifth aspect of the present invention, for example, the insulating layer is preferably an $SiO_2$ layer.

In the substrate manufacturing method according to the fifth aspect of the present invention, for example, the non-porous layer preferably comprises a compound semiconductor layer.

In the substrate manufacturing method according to the fifth aspect of the present invention, for example, the second substrate is preferably an Si substrate.

In the substrate manufacturing method according to the fifth aspect of the present invention, for example, the second substrate is preferably an Si substrate having an oxide film on a surface.

In the substrate manufacturing method according to the fifth aspect of the present invention, for example, the second substrate is preferably a transparent substrate.

In the substrate manufacturing method according to the fifth aspect of the present invention, for example, the second substrate is preferably an insulating substrate.

In the substrate manufacturing method according to the fifth aspect of the present invention, for example, the second substrate is preferably a quartz substrate.

The substrate manufacturing method according to the fifth aspect of the present invention preferably further comprises, e.g., after the removal step, the planarization step of planarizing the second substrate after separation.

In the substrate manufacturing method according to the fifth aspect of the present invention, for example, the planarization step preferably comprises performing annealing in an atmosphere containing hydrogen.

In the substrate manufacturing method according to the fifth aspect of the present invention, for example, the removal step preferably comprises selectively etching the porous layer using, as an etchant, a solution selected from the group consisting of a) hydrofluoric acid, b) a solution mixture prepared by adding at least one of an alcohol and hydrogen peroxide to hydrofluoric acid, c) buffered hydrofluoric acid, and d) a solution mixture prepared by adding at least one of an alcohol and hydrogen peroxide to buffered hydrofluoric acid.

In the substrate manufacturing method according to the fifth aspect of the present invention, for example, the removal step preferably comprises selectively etching the porous layer using an etchant whose etching rate is higher for the porous layer than for a compound semiconductor.

In the substrate manufacturing method according to the fifth aspect of the present invention, for example, the removal step preferably comprises selectively polishing the porous layer using the non-porous layer as a stopper.

In the substrate manufacturing method according to the fifth aspect of the present invention, for example, the bonding step preferably comprises bringing the first substrate having the non-porous layer into tight contact with the second substrate.

In the substrate manufacturing method according to the fifth aspect of the present invention, for example, the bonding step preferably comprises bringing the first substrate having the non-porous layer into tight contact with the second substrate and then performing a process selected from the group consisting of anodic bonding, pressing, annealing, and a combination thereof.

According to the sixth aspect of the present invention, there is provided a method of manufacturing a semiconductor thin film, comprising the first formation step of forming a porous layer on a surface of a substrate according to any one of the above substrate processing methods, the second formation step of forming a semiconductor thin film on the porous layer, and the separation step of separating a substrate obtained in the second formation step at the porous layer.

In the semiconductor thin film manufacturing method according to the sixth aspect of the present invention, for example, the separation step preferably comprises bonding a film to the semiconductor thin film of the substrate obtained in the second formation step and removing the film to separate the substrate at the porous layer.

Other features and advantages of the present invention will be apparent from the following description taken in conjunction with the accompanying drawings, in which like reference characters designate the same or similar parts throughout the figures thereof.

BRIEF DESCRIPTION OF THE DRAWINGS

The accompanying drawings, which are incorporated in and constitute a part of the specification, illustrate embodiments of the invention and, together with the description, serve to explain the principles of the invention.

FIG. 6 is a view showing the schematic arrangement of an automatic process line having the anodizing apparatus 100 shown in FIG. 3.

DETAILED DESCRIPTION OF THE PREFERRED EMBODIMENTS

Preferred embodiments of the present invention will be described below with reference to the accompanying drawings.

First, the process of manufacturing a semiconductor substrate according to the first embodiment of the present invention will be described. FIGS. 1A to 1F are views showing the steps in manufacturing the semiconductor substrate according to the first embodiment of the present invention.

Figure 1A:
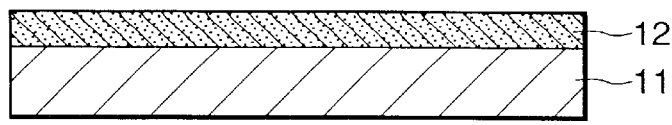
FIGS. 1A to 1F are views showing the steps in manufacturing a semiconductor substrate according to the first embodiment of the present invention.

In the step shown in FIG. 1A, a single-crystal Si substrate 11 is prepared, and a porous layer 12 is formed on the upper surface.

Figure 1B:
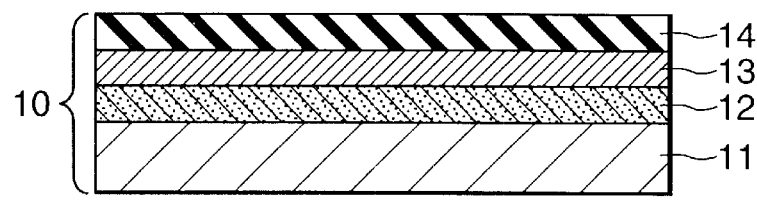

In the step shown in FIG. 1B, at least one non-porous layer is formed on the porous layer 12 to prepare a first substrate 10. In the example shown in FIG. 1B, two non-porous layers 13 and 14 are formed. As the lower non-porous layer 13, for example, a single-crystal Si layer is preferable. This single-crystal Si layer can be used as an active layer in, e.g., an SOI substrate. As the non-porous layer 14 on the upper surface side, for example, an $SiO_2$ layer (insulating layer) is preferable. This $SiO_2$ layer can be preferably used to separate the active layer from the bonding interface.

As a non-porous layer, a polysilicon layer, amorphous Si layer, metal layer, compound semiconductor layer, or superconducting layer may also be used. A device such as a MOSFET may be formed at this time.

Figure 1C:
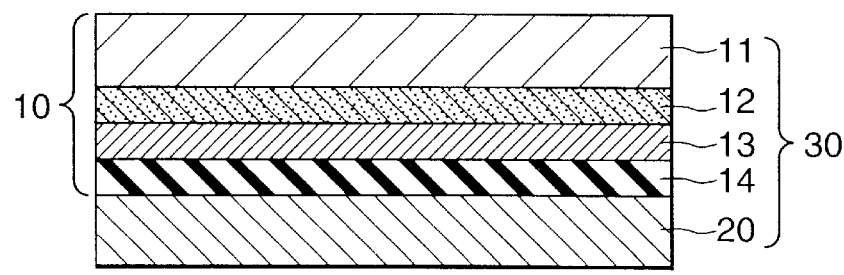

In the step shown in FIG. 1C, the first substrate 10 and an independently prepared second substrate 20 are brought into contact with each other via the non-porous layers 13 and 14 at room temperature. After that, the first substrate 10 and second substrate 20 are bonded by anodic bonding, pressing, annealing, or a combination thereof to prepare a bonded substrate stack 30.

When a single-crystal Si layer is formed as the non-porous layer 13, preferably, an $SiO_2$ layer is formed on the surface of the single-crystal Si layer by, e.g., thermal oxidation, and then the first substrate 10 and second substrate 20 are bonded, as described above.

As the second substrate 20, not only an Si substrate but also a substrate prepared by forming an $SiO_2$ layer on an Si substrate, a transparent substrate or insulating substrate such as a quartz substrate, or sapphire substrate is preferably used. The material of the second substrate is not limited to this, and a substrate of any other type may be employed as long as the bonding interface is sufficiently flat. Instead of the second substrate 20, a flexible film may be employed.

When the non-porous layer 13 is not an Si layer, or an Si substrate is not employed as the second substrate 20, the non-porous layer 14 as an insulating layer need not be formed.

In bonding, an insulating thin plate may be inserted between the first substrate 10 and the second substrate 20 to form a three-layered structure.

Figure 1D:
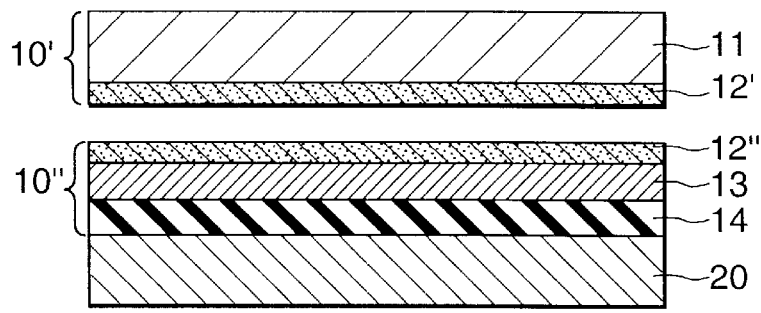

In the step shown in FIG. 1D, the bonded substrate stack 30 is separated into two substrates at the porous layer 12. To separate the bonded substrate stack, for example, a fluid is injected into the porous layer 12, a force (e.g., press force or tensile force) is applied in a direction perpendicular to the surface, external pressure such as a shearing force is applied to the bonded substrate stack 30 in the planar direction, the porous Si layer 12 is expanded by oxidizing it from the peripheral portion, thereby generating internal pressure in the porous Si layer 12, pulsed heat is applied to the bonded substrate stack 30 to apply thermal stress to the porous layer 12, the porous layer 12 is softened, or a wedge is inserted between the two substrates of the bonded substrate stack 30. Another method may be employed. For the method of injecting a fluid into the porous layer 12, a liquid such as pure water, or a gas such as nitrogen gas, air, oxygen gas, hydrogen gas, carbon dioxide gas, or an inert gas can be preferably used as the fluid.

Instead of separating the bonded substrate stack 30 into two substrates, the structure from the back surface of the first substrate 10 to the porous layer 12 in the bonded substrate stack 30 may be removed by grinding or polishing.

With this separation process, the bonded substrate stack 30 is separated into a substrate 10' having a porous layer 12' on the single-crystal Si substrate 11, and a substrate (20+10") having the non-porous layer (e.g., insulating layer) 14, non-porous layer (e.g., single-crystal Si layer) 13, and porous layer 12" sequentially on the second substrate 20.

Figure 1E:
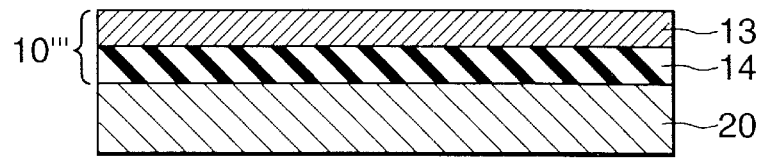

In the step shown in FIG. 1E, the porous layer 12" on the second substrate 20 is removed. When the non-porous layer 13 is a single-crystal Si layer, at least one etchant selected from a normal etchant, for etching Si, hydrofluoric acid as an etchant for selectively etching porous Si, a solution mixture prepared by adding at least one of an alcohol and hydrogen peroxide to hydrofluoric acid, buffered hydrofluoric acid, or a solution mixture prepared by adding at least one of an alcohol and hydrogen peroxide to buffered hydrofluoric acid is used to remove only the porous Si layer 12" by electroless wet chemical etching, With this process, the non-porous layers 14 and 131 can be left on the second substrate 20. Since the porous Si has a large surface area, only porous Si can be selectively etched by using a normal Si etchant.

Alternatively, using the non-porous layer 13 as a polishing stooper, the porous Si layer 12" may be selectively removed by polishing.

When a compound semiconductor layer is formed as the non-porous layer 13, for example, an etchant whose Si etching rate is higher than that for a compound semiconductor is used to selectively chemically etch only the porous Si layer 12". With this process, a single-crystal compound semiconductor thin layer (non-porous layer 13) can be left on the second substrate 20. Alternatively, using the single-crystal compound semiconductor layer (non-porous layer 13) as a polishing stopper, the porous Si layer 12" may be selectively removed by polishing.

FIG. 1E shows a semiconductor substrate manufactured by the above processes. According to the above processes, a non-porous thin film (e.g., a single-crystal Si thin film) having averaged and uniform film thickness can be formed in the entire region on the second substrate 20.

For example, the semiconductor substrate having a single-crystal Si layer as the upper-surface-side non-porous layer 13 and an $SiO_2$ layer as the inner non-porous layer 14 can be used as an SOI substrate. When an insulating substrate is employed as the second substrate 20, a semiconductor substrate suitable to manufacture an insulating-isolated electronic device can be formed.

Figure 1F:
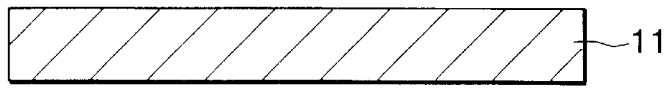

In the step shown in FIG. 1F, the porous layer 12' remaining on the single-crystal Si substrate 11 is removed. If surface planarity is poor beyond the allowance, the surface of the single-crystal Si substrate 11 is planarized whereby this substrate can be used as a single-crystal Si substrate 11 used to form the first substrate 10, or the second substrate 20.

Next, the process of manufacturing a semiconductor substrate according to the second embodiment of the present invention will be described. FIGS. 2A to 2F are views showing steps in manufacturing the semiconductor substrate according to the second embodiment of the present invention.

Figure 2A:
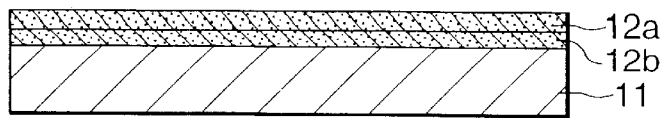
FIGS. 2A to 2F are views showing the steps in manufacturing a semiconductor substrate according to the second embodiment of the present invention.

In the step shown in FIG. 2A, a single-crystal Si substrate 11 is prepared, and two porous layers 12a and 12b having different porosities are formed on the upper surface side. Three or more porous layers may be formed.

The uppermost porous layer 12a preferably has a porosity of, e.g., 30% or less to form a high-quality epitaxial layer thereon. The second porous layer 12b preferably has a porosity of, e.g., 30% or more to facilitate separation.

Figure 2B:
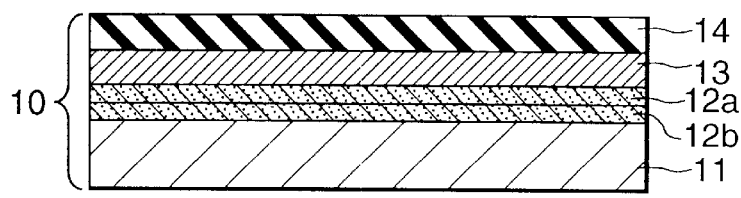

In the step shown in FIG. 2B, at least one non-porous layer is formed on the uppermost porous layer 12a to prepare a first substrate 10. In the example shown in FIG. 2B, two non-porous layers 13 and 14 are formed. As the lower non-porous layer 13, for example, a single-crystal Si layer is preferable. This single-crystal Si layer can be used as an active layer in, e.g., an SOI substrate. As the non-porous layer 14 on the upper surface side, for example, an $SiO_2$ layer (insulating layer) is preferable. This $SiO_2$ layer can be preferably used to separate the active layer from the bonding interface.

As a non-porous layer, a polysilicon layer, amorphous Si layer, metal layer, compound semiconductor layer, or superconducting layer may also be used. A device such as a MOSFET may be formed at this time.

Figure 2C:
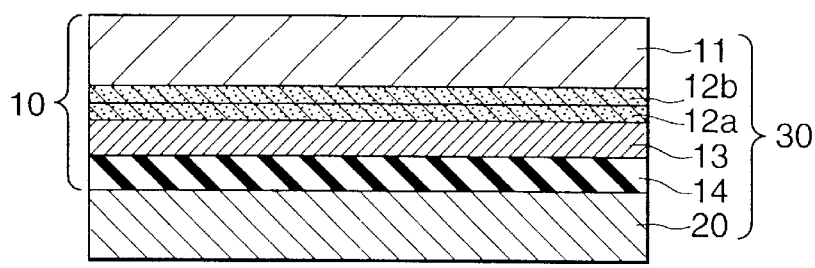

In the step shown in FIG. 2C, the first substrate 10 and an independently prepared second substrate 20 are brought into contact with each other via the non-porous layers at room temperature. After that, the first substrate 10 and second substrate 20 are bonded by anodic bonding, pressing, annealing, or a combination thereof to prepare a bonded substrate stack 30.

When a single-crystal Si layer is formed as the non-porous layer 13, preferably, an $SiO_2$ layer is formed on the surface of the single-crystal Si layer by, e.g., thermal oxidation, and then the first substrate 10 and second substrate 20 are bonded, as described above.

As the second substrate 20, not only an Si substrate but also a substrate prepared by forming an $SiO_2$ layer on an Si substrate, a transparent substrate or insulating substrate such as a quartz substrate, or sapphire substrate is preferably used. The material of the second substrate 20 is not limited to this, and a substrate of any other type may be employed as long as the bonding interface is sufficiently flat. Instead of the second substrate 20, a flexible film may be employed.

When the non-porous layer 13 is not an Si layer, or an Si substrate is not employed as the second substrate 20, the non-porous layer 14 as an insulating layer need not be formed.

In bonding, an insulating thin plate may be inserted between the first substrate 10 and the second substrate 20 to form a three-layered structure.

Figure 2D:
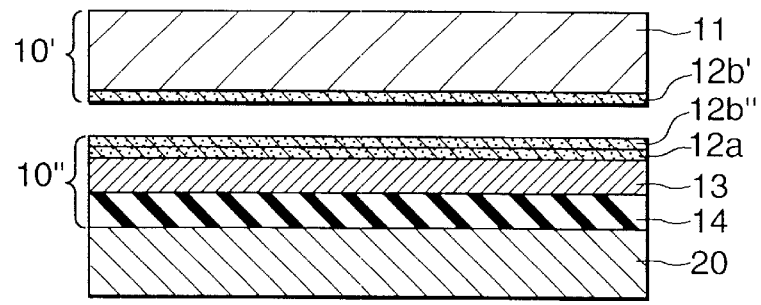

In the step shown in FIG. 2D, the bonded substrate stack 30 is separated into two substrates at the porous layers 12a and 12b and, more particularly, at the lower porous layer 12b. To separate the bonded substrate stack, for example, a fluid is injected into the porous layers 12 and 12b, a force (e.g., press force or tensile force) is applied in a direction perpendicular to the surface, external pressure such as a shearing force is applied to the bonded substrate stack 30 in the planar direction, the porous Si layers 12a and 12b are expanded by oxidizing them from the peripheral portion, thereby generating internal pressure in the porous Si layers 12a and 12b, pulsed heat is applied to the bonded substrate stack 30 to apply thermal stress to the porous layers 12a and 12b, the porous layers 12a and 12b are softened, or a wedge is inserted between the two substrates of the bonded substrate stack 30. Another method may be employed. For the method of injecting a fluid into the porous layers 12a and 12b, a liquid such as pure water, or a gas such as nitrogen gas, air, oxygen gas, hydrogen gas, carbon dioxide gas, or an inert gas can be preferably used as the fluid.

Instead of separating the bonded substrate stack 30 into two substrates, the structure from the back surface of the first substrate 10 to the porous layers 12a and 12b in the bonded substrate stack 30 may be removed by grinding or polishing.

With this separation process, the bonded substrate stack 30 is separated into a substrate 10' having a porous layer 12b' on the single-crystal Si substrate 11, and a substrate (20+10") having the non-porous layer (e.g., insulating layer) 14, non-porous layer (e.g., single-crystal Si layer) 13, porous layer 12a, and porous layer 12b" sequentially on the second substrate 20.

Figure 2E:
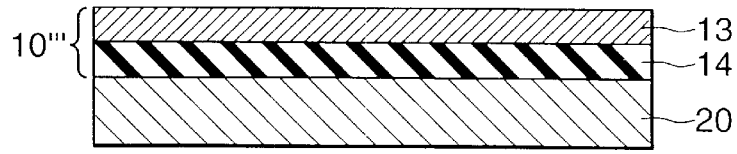

In the step shown in FIG. 2E, the porous layers 12a and 12b" on the second substrate 20 is removed. When the non-porous layer 13 is a single-crystal Si layer, at least one etchant selected from a normal etchant, for etching Si, hydrofluoric acid as an etchant for selectively etching porous Si, a solution mixture prepared by adding at least one of an alcohol and hydrogen peroxide to hydrofluoric acid, buffered hydrofluoric acid, or a solution mixture prepared by adding at least one of an alcohol and hydrogen peroxide to buffered hydrofluoric acid is used to remove only the porous Si layers 12 and 12b" by electroless wet chemical etching, With this process, the non-porous layers 14 and 131 can be left on the second substrate 20. Since the porous Si has a large surface area, only porous Si can be selectively etched by using a normal Si etchant.

Alternatively, using the non-porous layer 13 as a polishing stopper, the porous Si layers 12a and 12b" may be selectively removed by polishing.

When a compound semiconductor layer is formed as the non-porous layer 13, for example, an etchant whose Si etching rate is higher than that for a compound semiconductor is used to selectively chemically etch only the porous Si layers 12a and 12b". With this process, a single-crystal compound semiconductor thin layer (non-porous layer 13) can be left on the second substrate 20. Alternatively, using the single-crystal compound semiconductor layer (non-porous layer 13) as a polishing stopper, the porous Si layers 12a and 12b" may be selectively removed by polishing.

FIG. 2E shows a semiconductor substrate manufactured by the above processes. According to the above processes, a non-porous thin film (e.g., a single-crystal Si thin film) having averaged and uniform film thickness can be formed in the entire region on the second substrate 20.

For example, the semiconductor substrate having a single-crystal Si layer as the upper-surface-side non-porous layer 13 and an $SiO_2$ layer as the inner non-porous layer 14 can be used as an SOI substrate. When an insulating substrate is employed as the second substrate 20, a semiconductor substrate suitable to manufacture an insulating-isolated electronic device can be formed.

Figure 2F:

In the step shown in FIG. 2F, the porous layer 12b' remaining on the single-crystal Si substrate 11 is removed. If surface planarity is poor beyond the allowance, the surface of the single-crystal Si substrate 11 is planarized whereby this substrate can be used as a single-crystal Si substrate 11 used to form the first substrate 10, or the second substrate 20.

An anodizing apparatus according to a preferred embodiment of the present invention, which is used for the step shown in FIG. 1A or 2B, i.e., to form a porous Si layer on the surface of the single-crystal Si substrate, will be described below.

Figure 3:
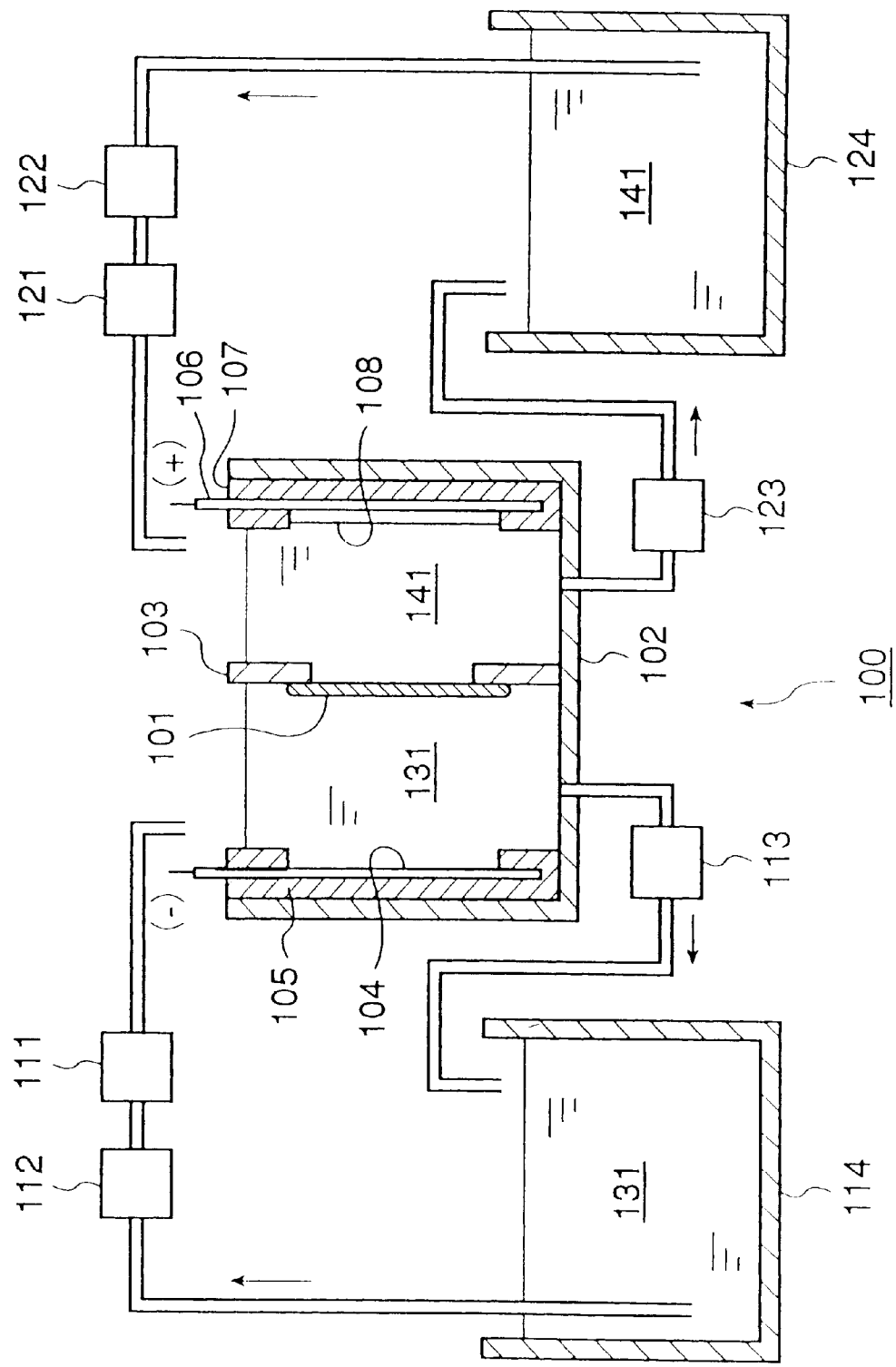
FIG. 3 is a view showing the schematic arrangement of an anodizing apparatus according to a preferred embodiment of the present invention.

FIG. 3 is a view showing the schematic arrangement of an anodizing apparatus according to a preferred embodiment of the present invention.

An anodizing apparatus 100 has, between a cathode 104 and an anode 106, a conductive partition 108 for preventing contamination of an Si substrate 101 to be processed or electrolyte by the anode 106. The conductive partition 108 is preferably constructed by, e.g., an Si substrate and, more particularly, an Si substrate having a resistivity almost equal to that of the Si substrate 101 to be processed. When the conductive partition 108 is formed from the same material as that of the Si substrate 101 to be processed, contamination of the Si substrate 101 to be processed can be prevented.

The conductive partition 108 is preferably detachable. In the example shown in FIG. 3, for example, as a mechanism for attaching/detaching the conductive partition 108, a vacuum chuck mechanism is preferably provided on the surface of the anode 106 or on an anode holder 107. The conductive partition 108 and anode 106 need be electrically connected. Hence, if a gap is formed between the conductive partition 108 and the anode 106, the gap must be filled with a conductive solution or conductive material.

The cathode 104 is held by a cathode holder 105.

In this anodizing apparatus 100, an anodizing tank 102 is separated, by the Si substrate 101 to be processed, into two tanks: a tank on the cathode 104 side and a tank on the conductive partition 108 (anode 106) side. Hence, a first electrolyte 131 supplied to the upper surface side of the Si substrate 101 to be processed and a second electrolyte 141 supplied to the back surface side of the Si substrate 101 can have different properties.

Electrolytes having different properties mean, e.g., electrolytes containing ions of different types or electrolytes containing ions at different concentrations.

In the anodizing apparatus 100, the space on the cathode 104 side of the anodizing tank 102, i.e., the space between the cathode 104 and the upper surface (surface on which a porous Si layer is to be formed) side of the Si substrate 101 to be processed is filled with the first electrolyte. 131 capable of forming a porous structure on the Si substrate 101.

On the other hand, the space on the anode 106 side of the anodizing tank 102, i.e., the space between the conductive partition 108 and the back surface (surface on which no porous Si layer is to be formed) side of the Si substrate 101 to be processed is preferably filled with, e.g., the second electrolyte 141 substantially incapable of forming a porous structure on the conductive partition 108. Electrolytes substantially incapable of forming a porous structure on the conductive partition 108 include electrolytes that can be regarded to have no ability of forming a porous structure on the conductive partition 108 because of their poor ability of forming a porous structure on the conductive partition 108.

An example of the second electrolyte 141 is an electrolyte capable of electoetching (or electropolishing) the conductive partition 108. When an electrolyte capable of electroetching the conductive partition 108 is used, the surface of the conductive partition 108 is entirely etched without forming any porous structure on the surface. Another example of the second electrolyte 141 is an electrolyte containing only ions that do not react with the material of the conductive partition 108.

More specifically, as the first electrolyte 131, an HF solution having a concentration of, e.g., 10% to 50% is preferable. As the second electrolyte 141, an HF solution having a concentration of, e.g., 10% or less is preferable, and an HF solution having a concentration of 2% or less is more preferably used.

When the electrolyte substantially incapable of forming a porous structure on the conductive partition 108 fills the space between the conductive partition 108 and the Si substrate 101 as the second electrolyte 141, porous structure formation on the conductive partition 108 can be prevented in forming a porous layer (anodizing) on the Si substrate 101. In addition, generation of particles from the conductive partition 108 can be reduced.

However, as in prior art, when the space between the Si substrate (101) to be processed and the conductive partition (108) formed from an Si material is filled with an electrolyte identical to that filling the space between the cathode (104) and the Si substrate (101), or an electrolyte capable of forming a porous structure on the conductive partition (108) like the Si substrate (101) to be processed, a porous structure is formed on the surface of the conductive partition (108). Hence, when one conductive partition (108) is attached to the anodizing tank (102), and a number of Si substrates (101) are anodized, a thick porous layer corresponding to the number of processed substrates is formed on the conductive partition.

When the conductive partition having the thick porous layer is continuously used, the porous layer finally physically breaks to generate particles of the material of the conductive partition or reaction product thereof. These particles contaminate the Si substrate to be processed or anodizing tank and also contaminate the electrolyte.

Under the condition in which a porous structure is formed on the conductive partition (108), the conductive partition breaks (particles are generated) conspicuously especially when a porous layer having a multilayered structure with different porosities is formed on the Si substrate (101) to be processed. Reasons for this are estimated as follows.

1) Since porous layers having different porosities are stacked on the conductive partition, pore walls cannot stand stress.
2) When a porous layer with high porosity is formed under a porous layer with low porosity, the porosity of the porous layer with high porosity increases as the depth from the surface of the conductive partition to that layer (overall thickness of the porous layer) increases. Hence, when the number of processed Si substrates increases, the porosity of the porous layer formed at the deepest portion of the conductive partition reaches the limit value to break pore walls.

Preferable procedures for forming a porous Si layer on an Si substrate using the anodizing apparatus 100 according to the preferred embodiment of the present invention will be described below.

First, while no electrolytes are contained in the anodizing tank 102, the Si substrate 101 to be processed is brought into contact with the chuck portion (e.g., chuck pad) of a substrate holder 103 by a conveyor robot or the like, and the substrate holder 103 is caused to chuck the Si substrate. The substrate holder 103 has a vacuum chuck mechanism as a chuck portion for holding the Si substrate 101.

The first electrolyte 131 is supplied by a pump 112 from a first tank 114 to the space between the cathode 104 and the Si substrate 101 of the anodizing tank 102 through a filter 111. Simultaneously, the second electrolyte 141 is supplied by a pump 122 from a second tank 124 to the space between the conductive partition 108 and the Si substrate 101 of the anodizing tank 102 through a filter 121.

As described above, the first electrolyte 131 is capable of forming a porous structure on the surface of the Si substrate 101 to be processed. The second electrolyte 141 is substantially incapable of forming a porous structure on the conductive partition 108.

When the spaces on the cathode 104 side and anode 106 side of the anodizing tank 102 are filled with the first electrolyte 131 and second electrolyte 141, respectively, a current with a predetermined magnitude is flowed between the cathode 104 and the anode 106 to form a porous layer having a predetermined porosity on the surface of the Si substrate 101 to be processed. At this time, the entire surface of the conductive partition 108 is electroetched without forming a porous structure.

Next, the first electrolyte 131 is discharged by a pump 113 from the bottom portion on the cathode 104 side of the anodizing tank 102 to the first tank 114. Simultaneously, the second electrolyte 141 is discharged by a pump 123 from the bottom portion on the anode 106 side of the anodizing tank 102 to the second tank 124.

The conveyor robot or the like detaches the processed Si substrate 101 from the substrate holder 103 and conveys it to a predetermined position (e.g., a carrier).

The process of forming one porous layer 12 on the surface of an Si substrate 11 (101), as shown in FIG. 1A, has been described above.

Two methods suitable to form two porous layers 12a and 12b on the Si substrate 11 (101), as shown in FIG. 2A, or three or more porous layers will be described next.

In the first method, after the first (upper) porous layer 12a is formed by flowing a current with a first current value between the cathode 104 and the anode 106, the second (lower) porous layer 12b is formed by flowing a current with a second current value between the cathode 104 and the anode 106. To form three or more porous layers, this process is repeated while changing the magnitude of the current to be flowed between the cathode 104 and the anode 106.

In the second method, after the first (upper) porous layer 12a is formed on the Si substrate 101, the first electrolyte 131 on the cathode 104 side is replaced with a third electrolyte, and the second (lower) porous layer 12b is formed on the Si substrate 101 using the third electrolyte. To form three or more porous layers, the process is repeated by further replacing the third electrolyte with other electrolytes.

Figure 4:
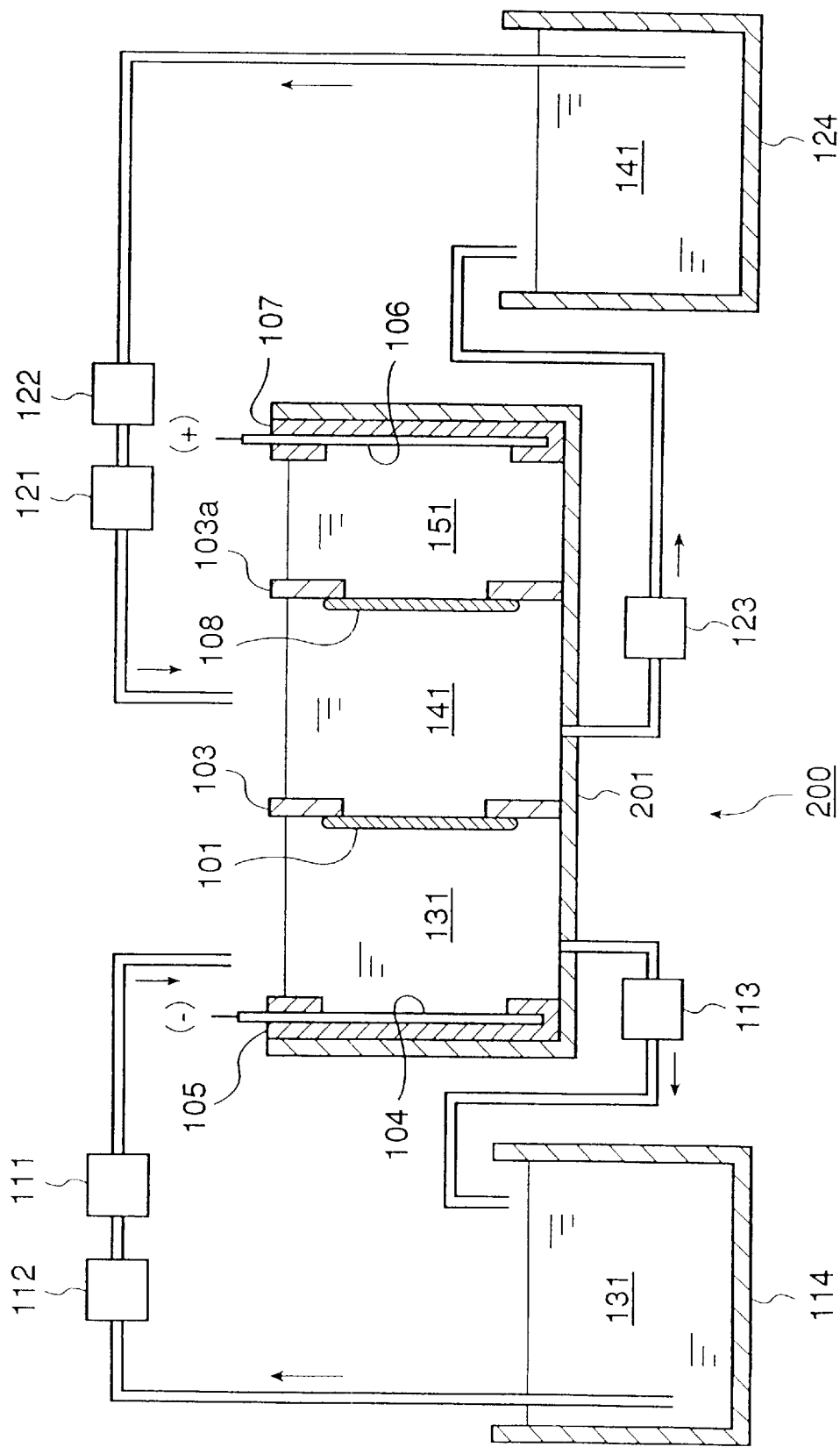
FIG. 4 is a view showing the schematic arrangement of an anodizing apparatus according to a modification of the anodizing apparatus shown in FIG. 3.

FIG. 4 is a view showing the schematic arrangement of an anodizing apparatus according to a modification of the anodizing apparatus 100 shown in FIG. 3. The same reference numerals as in the anodizing apparatus 100 shown in FIG. 3 denote substantially the same elements in FIG. 4.

An anodizing tank 201 of an anodizing apparatus 200 has a conductive partition holder 103a exclusively used to fix the conductive partition 108. This anodizing tank 201 is used while keeping the space between the conductive partition 108 and the anode 106 filled with a conductive solution 151. The conductive solution 151 is used to simply electrically connect the conductive partition 108 to the anode 106.

The process of the Si substrate 101 by the anodizing apparatus 200 is the same as that by the anodizing apparatus 100 shown in FIG. 3.

Figure 5:
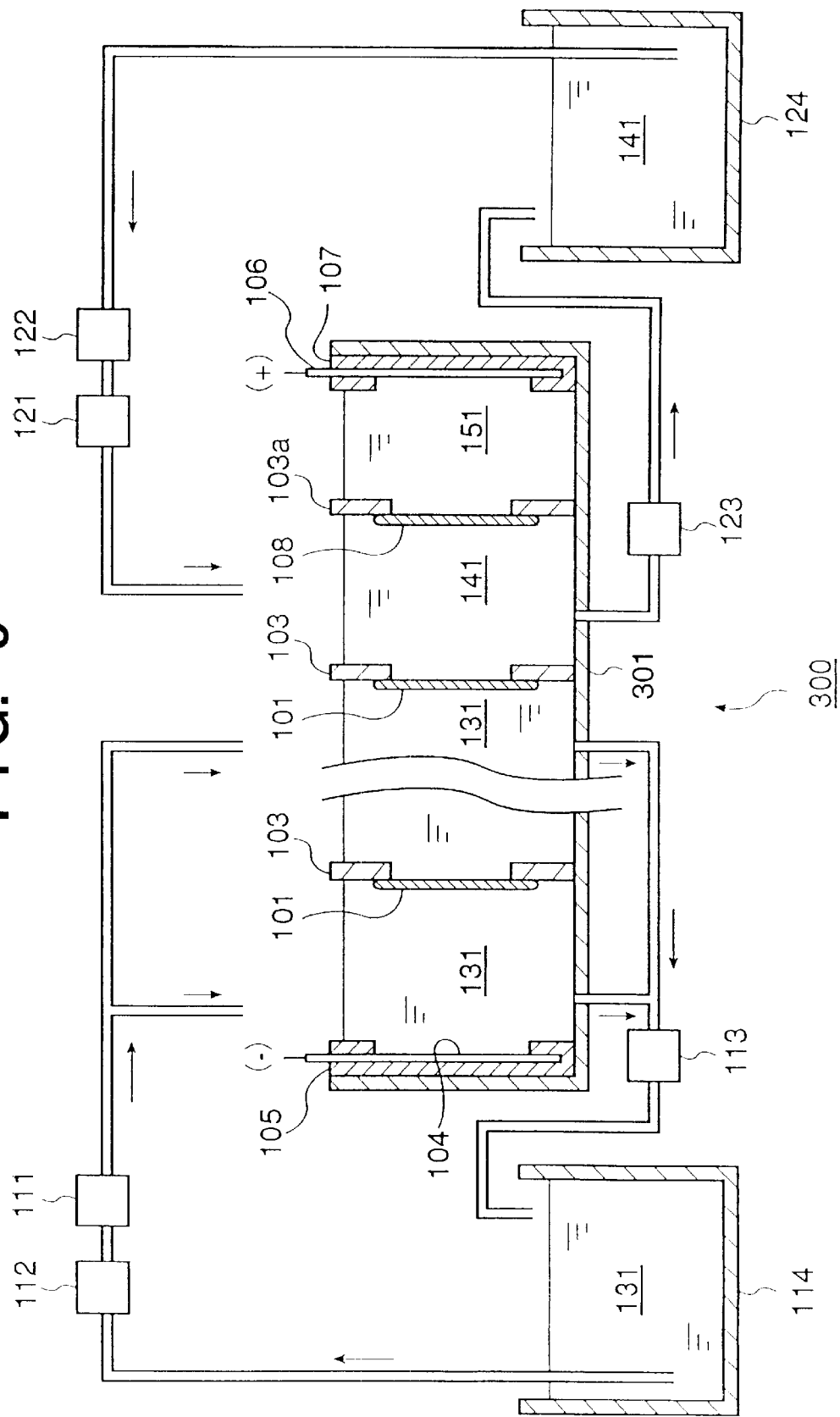
FIG. 5 is a view showing the schematic arrangement of an anodizing apparatus according to another modification of the anodizing apparatus shown in FIG. 3.

FIG. 5 is a view showing the schematic arrangement of an anodizing apparatus according to a modification of the anodizing apparatus shown in FIG. 4. An anodizing apparatus 300 can batch-process a number of Si substrates. More specifically, in the anodizing apparatus 300, a number of substrate holders 103 are attached to an anodizing tank 301.

The process of the Si substrate 101 by the anodizing apparatus 300 is the same as that by the anodizing apparatus 100 shown in FIG. 4.

Further, a modification of the anodizing apparatus shown in FIG. 3, which has a number of substrate holders 103 and can batch-process a number of Si substrates, is also preferable.

FIG. 6 is a view showing the schematic arrangement of an automatic process line having the anodizing apparatus 100 shown in FIG. 3. Referring to FIG. 6, the first electrolyte 131 and second electrolyte 141 as external elements of the anodizing tank 102 are omitted.

In place of the anodizing apparatus 100 shown in FIG. 3, the anodizing apparatus 200 shown in FIG. 4 or the anodizing apparatus 300 shown in FIG. 5 may be employed.

The processing procedure by an automatic manufacturing line 700 will be described below. This automatic manufacturing line 700 is controlled by a computer 750 having an input system such as an operation panel.

The automatic manufacturing line 700 starts the following series of processes when a wafer carrier 702 storing Si substrates 101 to be processed is placed on a loader 701, and the start of process is instructed by the operator through the operation panel of the computer 750. Before the start of process, the anodizing tank 102 is not filled with an electrolyte.

First, under the control of the computer 750, a first conveyor robot 721 chucks, by its chuck portion, the back surface of an Si substrate 101 in the wafer carrier 702, extracts the Si substrate, and moves it to the cathode 104 side in the anodizing tank 102. Under the control of the computer 750, a second conveyor robot 722 brings its chuck portion into contact with the back surface of the Si substrate 101 through the opening portion of the substrate holder 103, chucks the Si substrate 101 by the chuck portion, receives the substrate from the first conveyor robot 721, and moves the Si substrate 101 to a position where it comes into contact with the chuck portion of the substrate holder 103. In this state, the Si substrate 101 is chucked by the chuck portion of the vacuum chuck mechanism of the substrate holder 103 under the control of the computer 750.

Under the control of the computer 750, the space between the cathode 104 and the Si substrate 101 is filled with the first electrolyte 131, and simultaneously, the space between the conductive partition 108 and the Si substrate 101 is filled with the second electrolyte 141.

Under the control of the computer 750, a current having a predetermined magnitude is flowed between the cathode 104 and the anode 106 of the Si substrate 101 to form a porous layer on the surface of the Si substrate 101. As described above, a porous layer having a multilayered structure may be formed on the surface of the Si substrate 101.

Under the control of the computer 750, the first electrolyte 131 between the cathode 104 and the Si substrate 101 is discharged, and simultaneously, the second electrolyte 141 between the conductive partition 108 and the Si substrate 101 is discharged.

Under the control of the computer 750, the second conveyor robot 722 chucks the back surface of the Si substrate 101 in the anodizing tank 102. After vacuum chuck by the substrate holder 103 is canceled, the second conveyor robot 722 detaches the Si substrate 101 from the substrate holder 103. Under the control of the computer 750, the second conveyor robot 722 transfers the Si substrate 101 to the first conveyor robot 721.

Under the control of the computer 750, the first conveyor robot 721 stores the Si substrate 101 in the wafer carrier 702 dipped in a cleaning tank 703 in advance.

When all Si substrates 101 in the wafer carrier 702 on the loader 701 are processed and stored in the wafer carrier 702 in the cleaning tank 703 by repeating the above process, the Si substrates 101 are cleaned and/or rinsed under the control of the computer 750.

Under the control of the computer 750, a third conveyor robot 731 extracts the Si substrates 101 in the cleaning tank 703 while keeping them stored in the wafer carrier 702 and conveys them to a spin drier 704. Under the control of the computer 750, the Si substrates 101 are dried by the spin drier 704.

Under the control of the computer 750, the third conveyor robot 731 conveys the Si substrates kept stored in the wafer carrier 702 onto an unloader 705.

Examples of anodizing by the above anodizing apparatus will be described next.

EXAMPLE 1

A single-crystal Si substrate was set in one of the above anodizing apparatuses, and one porous Si layer was formed. The anodizing conditions at that time were as follows. "Current density" means the current density of a current flowed between a cathode 104 and an anode 106, "first electrolyte" means an electrolyte 131 filing the space between the cathode 104 and the single-crystal Si substrate to be processed, and "second electrolyte" means an electrolyte 141 filling the space between a conductive partition 108 and the single-crystal Si substrate (this also applies to other examples).

Current density: 7 (mA·cm$^{-2}$)

First electrolyte: HF:H$_2$O:C$_2$H$_5$OH=1:1:1

Second electrolyte: HF:H$_2$O:C$_2$H$_5$OH=0.5:67:33

Process time: 11 (min)

Porous Si thickness (target): 12 ($\mu$m)

Material of Conductive Partition: Si

Under these anodizing conditions, 100 Si substrates were processed without exchanging the conductive partition 108. No porous layer was formed on the conductive partition 108, and the surface was electroetched (electropolished) Hence, no particles were generated from the conductive partition. When the 100 Si substrates were processed, the conductive partition 108 was thinned down by about 145 $\mu$m by electroetching.

EXAMPLE 2

A single-crystal Si substrate was set in one of the above anodizing apparatuses, and a porous layer having a three-layered structure was formed by changing the current density. The anodizing conditions for forming the first to third porous layers were as follows.

<Anodizing Conditions for Forming First Porous Layer>

Current density: 7 (mA·cm$^{-2}$)

First electrolyte: HF:H$_2$O:C$_2$H$_5$OH=1:1:1

Second electrolyte: HF:H$_2$O:C$_2$H$_5$OH=0.5:67:33

Process time: 11 (min)
Porous Si thickness (target): 12 ($\mu$m)
Material of Conductive Partition: Si
<Anodizing Conditions for Forming Second Porous Layer>
   Current density: 20 (mA·cm$^{-2}$)
   First electrolyte: HF:H$_2$O:C$_2$H$_5$OH=1:1:1
   Second electrolyte: HF:H$_2$O:C$_2$H$_5$OH=0.5:67:33
   Process time: 3 (min)
   Porous Si thickness (target): 3 ($\mu$m)
   Material of Conductive Partition: Si
<Anodizing Conditions for Forming Third Porous Layer>
   Current density: 7 (mA·cm$^{-2}$)
   First electrolyte: HF:H$_2$O:C$_2$H$_5$OH=1:1:1
   Second electrolyte: HF:H$_2$O:C$_2$H$_5$OH=0.5:67:33
   Process time: 1 (min)
   Porous Si thickness (target): 1.1 ($\mu$m)
   Material of Conductive Partition: Si Under these anodizing conditions, 100 Si substrates were processed without exchanging a conductive partition 108. No porous layer was formed on the conductive partition 108, and the surface was electroetched (electropolished). Hence, no particles were generated from the conductive partition. When the 100 Si substrates were processed, the conductive partition 108 was thinned down by about 271 $\mu$m by electroetching.

The above result remained unchanged in either a case wherein the porous layers were formed by continuously forming first to third porous layers on each of 100 Si substrates or a case wherein first porous layers were formed on 100 Si substrates, then second porous layers were formed on the 100 Si substrates, and finally third porous layers were formed on the Si substrates.

EXAMPLE 3

A single-crystal Si substrate was set in one of the above anodizing apparatuses, and a porous layer having a two-layered structure was formed by changing the current density. The anodizing conditions for forming the first and second porous layers were as follows.
<Anodizing Conditions for Forming First Porous Layer>
   Current density: 7 (mA·cm$^{-2}$)
   First electrolyte: HF:H$_2$O:C$_2$H$_5$OH=1:1:1
   Second electrolyte: HF:H$_2$O:C$_2$H$_5$OH=0.5:67:33
   Process time: 5 (min)
   Porous Si thickness (target): 6 ($\mu$m)
   Material of Conductive Partition: Si
<Anodizing Conditions for Forming Second Porous Layer>
   Current density: 30 (mA·cm$^{-2}$)
   First electrolyte: HF:H$_2$O:C$_2$H$_5$OH=1:1:1
   Second electrolyte: HF:H$_2$O:C$_2$H$_5$OH=0.5:67:33
   Process time: 110 (sec)
   Porous Si thickness (target): 3 ($\mu$m)
   Material of Conductive Partition: Si Under these anodizing conditions, 100 Si substrates were processed without exchanging the conductive partition 108. No porous layer was formed on the conductive partition 108, and the surface was electroetched (electropolished). Hence, no particles were generated from the conductive partition. When the 100 Si substrates were processed, the conductive partition 108 was thinned down by about 169 $\mu$m by electroetching.

The above result remained unchanged in either a case wherein the porous layers were formed by continuously forming first and second porous layers on each of 100 Si substrates or a case wherein first porous layers were formed on 100 Si substrates, and then second porous layers were formed on the 100 Si substrates.

EXAMPLE 4

A single-crystal Si substrate was set in one of the above anodizing apparatuses, and porous layers 12a and 12b having a two-layered structure were formed by changing the current density (FIG. 2A). The anodizing conditions for forming the first and second porous layers were as follows.
<Anodizing Conditions for Forming First Porous Layer>
   Current density: 7 (mA·cm$^{-2}$)
   First electrolyte: HF:H$_2$O:C$_2$H$_5$OH=1:1:1
   Second electrolyte: HF:H$_2$O:C$_2$H$_5$OH=0.5:67:33
   Process time: 11 (min)
   Porous Si thickness (target): 12 ($\mu$m)
   Material of Conductive Partition: Si
<Anodizing Conditions for Forming Second Porous Layer>
   Current density: 20 (mA·cm$^{-2}$)
   First electrolyte: HF:H$_2$O:C$_2$H$_5$OH=1:1:1
   Second electrolyte: HF:H$_2$O:C$_2$H$_5$OH=0.5:67:33
   Process time: 3 (min)
   Porous Si thickness (target): 3 ($\mu$m)
   Material of Conductive Partition: Si Under these anodizing conditions, 100 Si substrates were processed without exchanging the conductive partition 108. No porous layer was formed on the conductive partition 108, and the surface was electroetched (electropolished) Hence, no particles were generated from the conductive partition. When the 100 Si substrates were processed, the conductive partition 108 was thinned down by about 145 $\mu$m by electroetching.

The above result remained unchanged in either a case wherein the porous layers were formed by continuously forming first and second porous layers on each of 100 Si substrates or a case wherein first porous layers were formed on 100 Si substrates, and then second porous layers were formed on the 100 Si substrates.

The substrate having the porous structure was oxidized in an oxygen atmosphere at 400° C. for 1 hr. With this oxidation, the inner surface of each pore in the porous layers 12a and 12b was covered with a thermal oxide film.

A 0.3-$\mu$m thick single-crystal Si layer 13 was epitaxially grown on the porous Si layer by CVD (Chemical Vapor Deposition) (FIG. 2B). The growth conditions were as follows. Since the surface of the porous Si layer was exposed to H$_2$ at the early stage of epitaxial growth, the pores on the surface were filled to form a flat surface.
<Epitaxial Growth Conditions>
   Source gas: SiH$_2$Cl$_2$/H$_2$
   Gas flow rate: 0.5/180 (1/min)
   Gas pressure: 80 (Torr)
   Temperature: 950 (° C.)
   Growth rate: 0.3 ($\mu$m/min)

A 200-nm thick SiO$_2$ layer 14 was formed on the surface of the epitaxially grown single-crystal Si layer 13 by thermal oxidation (FIG. 2B).

The surface of this SiO$_2$ layer and that of an independently prepared Si substrate (second substrate) 20 were brought into tight contact with each other and then bonded by annealing at 1,000° C. for 1 hr to prepare a bonded substrate stack 30 (FIG. 2C). This annealing can be performed in N$_2$, an inert gas atmosphere, or an oxidation atmosphere, or a combination thereof.

The bonded substrate stack 30 was processed from the back surface side of the first substrate 10 by grinding, polishing, or etching until the porous Si layer 12b was exposed (FIG. 2D).

The porous Si layers 12a and 12b" remaining on the bonded substrate stack 30 were etched using a solution mixture of 49% hydrofluoric acid, 30% hydrogen peroxide, and water (FIG. 2E). The single-crystal Si layer 13 functioned as an etching stopper, so the porous Si layer was selectively etched.

Since the etching rate for non-porous single-crystal Si by this etchant is very low, the selectivity ratio of porous single-crystal Si to non-porous single-crystal Si reaches $10^5$ or more. Hence, the etching amount (about several ten Å) of the non-porous layer can be neglected in practical use.

With the above process, an SOI substrate (FIG. 2E) having the 0.2-$\mu$m thick single-crystal Si layer 13 on the Si oxide film 14 was obtained. When the film thickness of the single-crystal Si layer of this SOI substrate was measured at 100 points on the entire surface, the film thickness uniformity was 201 nm±4 nm.

In addition, annealing was performed in hydrogen at 1,100° C. for 1 hr. The surface roughness was evaluated with an atomic force microscope. The root-mean-square roughness in a 50-$\mu$m square area was approximately 0.2 nm. This nearly equals that of a commercially available normal Si wafer.

Sectional observation with a transmission electron microscope revealed no new crystal defects in the Si layer, indicating that satisfactory crystallinity was maintained.

The same result as described above was obtained even when no oxide film was formed on the surface of the epitaxially grown single-crystal Si layer.

EXAMPLE 5

Example 5 is a modification to Example 4. More specifically, the manufacturing conditions of Example 4 were changed as follows.

1) Thickness of the epitaxial Si layer: 2 $\mu$m
2) Thickness of the thermal oxide film on the surface the epitaxial Si layer: 0.1 $\mu$m
3) Second substrate: Si substrate having a 1.9-$\mu$m thick $SiO_2$ layer
4) Bonding process: after the surfaces of first and second substrates were exposed to a nitrogen plasma, the two substrates were brought into tight contact with each other and annealed at 400° C. for 10 hrs.

EXAMPLE 6

Example 6 is anther modification to Example 4. More specifically, the manufacturing conditions of Example 4 were changed as follows.

1) Second substrate: quartz substrate
2) Bonding process: after the surfaces of first and second substrates were exposed to a nitrogen plasma, the two substrates were brought into tight contact with each other and annealed at 200° C. for 24 hrs.
3) Annealing in hydrogen: annealing was further performed in hydrogen at 970° C. for 2 hrs. (When the surface roughness was evaluated with an atomic force microscope, the root-mean-square roughness in a 50-$\mu$m square area was approximately 0.2 nm. This nearly equals that of a commercially available normal Si wafer).

EXAMPLE 7

A single-crystal Si substrate 11 was set in one of the above anodizing apparatuses, and one porous Si layer 12 was formed (FIG. 1A). The anodizing conditions at that time were as follows.

Current density: 7 (mA·cm$^{-2}$)
First electrolyte: $HF:H_2O:C_2H_5OH=1:1:1$
Second electrolyte: $HF:H_2O:C_2H_5OH=0.5:67:33$
Process time: 5 (min)
Porous Si thickness (target): 6 ($\mu$m)
Material of Conductive Partition: Si Under these anodizing conditions, 100 Si substrates were processed without exchanging a conductive partition 108. No porous layer was formed on the conductive partition 108, and the surface was electroetched (electropolished) Hence, no particles were generated from the conductive partition. When the 100 Si substrates were processed, the conductive partition 108 was thinned down by about 66 $\mu$m by electroetching.

The substrate having the porous structure was oxidized in an oxygen atmosphere at 400° C. for 1 hr. With this oxidation, the inner surface of each pore in the porous Si layer 12 was covered with a thermal oxide film.

A 1-$\mu$m thick single-crystal GaAs layer 13 was epitaxially grown on the porous Si layer 12 by MOCVD (Metal Organic Chemical Vapor Deposition) (FIG. 1B). The growth conditions were as follows.

<Epitaxial Growth Conditions>

Source gas: $TMG/AsH_5/H_2$
Gas pressure: 80 (Torr)
Temperature: 700 (° C.)

The surface of the GaAs layer 13 and that of an independently prepared Si substrate (second substrate) 20 were brought into tight contact with each other to prepare a bonded substrate stack 30 (FIG. 1C).

The bonded substrate stack 30 was processed from the back surface side of a first substrate 10 by grinding, polishing, or etching until the porous Si layer 12 was exposed (FIG. 1D).

A porous Si layer 12" remaining on the bonded substrate stack 30 was etched at 110° C. using a solution mixture (etchant) of etylenediamine/pyrocatechol/water (mixing ratio was 17 ml:3 g:8 ml). The single-crystal GaAs layer 13 functioned as an etching stopper, so porous Si was selectively etched.

The etching rate for single-crystal GaAs by this etchant is very low. The etching amount (about several ten Å) of single-crystal GaAs can be neglected in practical use.

With the above process, a substrate having the 1-$\mu$m thick single-crystal GaAs layer 13 on the single-crystal Si substrate 20 was obtained. When the film thickness of the single-crystal GaAs layer of this substrate was measured at 100 points on the entire surface, the film thickness uniformity was 1 $\mu$m±29.8 nm.

Sectional observation with a transmission electron microscope revealed no new crystal defects in the GaAs layer, indicating that satisfactory crystallinity was maintained.

When an Si substrate having an oxide film was used as a support substrate, a substrate having a GaAs layer on the insulating film could be formed.

EXAMPLE 8

A single-crystal Si substrate was set in one of the above anodizing apparatuses, and one porous Si layer 12 was formed (FIG. 1A). The anodizing conditions at that time were as follows.

Current density: 7 (mA·cm$^{-2}$)
First electrolyte: $HF:H_2O:C_2H_5OH=1:1:1$

Second electrolyte: HF:H$_2$O:C$_2$H$_5$OH=0.5:67:33
Process time: 11 (min)
Porous Si thickness (target): 12 ($\mu$m)
Material of Conductive Partition: Si Under these anodizing conditions, 100 Si substrates were processed without exchanging a conductive partition 108. No porous layer was formed on the conductive partition 108, and the surface was electroetched (electropolished). Hence, no particles were generated from the conductive partition. When the 100 Si substrates were processed, the conductive partition 108 was thinned down by about 145 $\mu$m by electroetching.

The substrate having the porous structure was oxidized in an oxygen atmosphere at 400° C. for 1 hr. With this oxidation, the inner surface of each pore in the porous Si layer 12 was covered with a thermal oxide film.

A 1-$\mu$m thick single-crystal InP layer 13 was epitaxially grown on the porous Si layer 12 by MOCVD (Metal Organic Chemical Vapor Deposition) (FIG. 1B).

The surface of the InP layer 13 and that of an independently prepared quartz substrate (second substrate) 20 were exposed to a nitrogen plasma, brought into tight contact with each other, and then annealed at 200° C. for 10 hrs to prepare a bonded substrate stack 30 (FIG. 1C).

A water jet having a diameter of 0.2 mm was ejected to the gap at the beveling of the bonded substrate stack 30, thereby separating the bonded substrate stack 30 into two substrates at the porous Si layer 12 (FIG. 1D).

A porous Si layer 12" remaining on the second substrate side was selectively etched using a solution mixture of 49% hydrofluoric acid, 30% hydrogen peroxide, and water while stirring the solution (FIG. 1E). The single-crystal InP layer 13 functioned as an etching stopper, so the porous Si layer 12" was selectively etched.

The etching rate for single-crystal InP by this etchant is very low. The etching amount (about several ten Å) of the single-crystal InP layer 13 can be neglected in practical use.

With the above process, a substrate (FIG. 1E) having the 1-$\mu$m thick single-crystal InP layer 13 on the quartz substrate 20 was obtained. When the film thickness of the single-crystal InP layer of this substrate was measured at 100 points on the entire surface, the film thickness uniformity was 1 $\mu$m±29.0 nm.

Sectional observation with a transmission electron microscope revealed no new crystal defects in the InP layer, indicating that satisfactory crystallinity was maintained.

EXAMPLE 9

In Example 9, both surfaces of a single-crystal Si substrate constructing a first substrate were subjected to each of the processes described in Examples 4 to 8.

EXAMPLE 10

A single-crystal Si substrate 11 was set in one of the above anodizing apparatuses, and porous layers 12a and 12b having a two-layered structure were formed by changing the current density (FIG. 2A). The anodizing conditions for forming the first and second porous layers were as follows.

<Anodizing Conditions for Forming First Porous Layer>
Current density: 7 (mA·cm$^{-2}$)
First electrolyte: HF:H$_2$O:C$_2$H$_5$OH=1:1:1
Second electrolyte: HF:H$_2$O:C$_2$H$_5$OH=0.5:67:33
Process time: 11 (min)
Porous Si thickness (target): 12 ($\mu$m)
Material of Conductive Partition: Si <Anodizing Conditions for Forming Second Porous Layer>
Current density: 20 (mA·cm$^{-2}$)
First electrolyte: HF:H$_2$O:C$_2$H$_5$OH=1:1:1
Second electrolyte: HF:H$_2$O:C$_2$H$_5$OH=0.5:67:33
Process time: 3 (min)
Porous Si thickness (target): 3 ($\mu$m)
Material of Conductive Partition: Si Under these anodizing conditions, 100 Si substrates were processed without exchanging a conductive partition 108. No porous layer was formed on the conductive partition 108, and the surface was electroetched (electropolished). Hence, no particles were generated from the conductive partition. When the 100 Si substrates were processed, the conductive partition 108 was thinned down by about 258 $\mu$m by electroetching.

The above result remained unchanged in either a case wherein the porous layers were formed by continuously forming first and second porous layers on each of 100 Si substrates or a case wherein first porous layers were formed on 100 Si substrates, and then second porous layers were formed on the 100 Si substrates.

The substrate having the porous structure was oxidized in an oxygen atmosphere at 400° C. for 1 hr. With this oxidation, the inner surface of each pore in the porous layers 12a and 12b was covered with a thermal oxide film.

A 0.3-$\mu$m thick single-crystal Si layer 13 was epitaxially grown on the porous Si layer 12a by CVD (Chemical Vapor Deposition) (FIG. 2B). The growth conditions were as follows. Since the surface of the porous Si layer was exposed to H$_2$ at the early stage of epitaxial growth, the pores on the surface were filled to form a flat surface.

<Epitaxial Growth Conditions>
Source gas: SiH$_2$Cl$_2$/H$_2$
Gas flow rate: 0.5/180 (1/min)
Gas pressure: 80 (Torr)
Temperature: 950 (° C.)
Growth rate: 0.3 ($\mu$m/min)

A 200-nm thick SiO$_2$ layer 14 was formed on the surface of the epitaxially grown single-crystal Si layer 13 by thermal oxidation (FIG. 2B).

The surface of this SiO$_2$ layer 14 and that of an independently prepared Si substrate (second substrate) 20 were brought into tight contact with each other and then bonded by annealing at 1,000° C. for 1 hr to prepare a bonded substrate stack 30 (FIG. 2C).

A water jet having a diameter of 0.2 mm was ejected to the gap at the beveling of the bonded substrate stack 30, thereby separating the bonded substrate stack 30 into two substrates at the second porous Si layer 12b (FIG. 2D).

The porous Si layers 12a and 12b" remaining on the second substrate side were etched using a solution mixture of 49% hydrofluoric acid, 30% hydrogen peroxide, and water (FIG. 2E). The single-crystal InP layer 13 functioned as an etching stopper, so the porous Si layers 12a and 12b" were selectively etched.

Since the etching rate for non-porous single-crystal Si by this etchant is very low, the selectivity ratio of porous single-crystal Si to non-porous single-crystal Si reaches 10$^5$ or more. Hence, the etching amount (about several ten Å) of the non-porous layer can be neglected in practical use.

With the above process, an SOI substrate (FIG. 2E) having the 0.2-$\mu$m thick single-crystal Si layer 13 on the Si oxide film 14 was obtained. When the film thickness of the single-crystal Si layer of this SOI substrate was measured at 100 points on the entire surface, the film thickness uniformity was 201 nm±4 nm.

In addition, annealing was performed in hydrogen at 1,100° C. for 1 hr. The surface roughness was evaluated with an atomic force microscope. The root-mean-square roughness in a 50-µm square area was approximately 0.2 nm. This nearly equals that of a commercially available normal Si wafer.

Sectional observation with a transmission electron microscope revealed no new crystal defects in the Si layer, indicating that satisfactory crystallinity was maintained.

The same result as described above was obtained even when no oxide film was formed on the surface of the epitaxially grown single-crystal Si layer.

Porous Si remaining on the first substrate side was also selectively etched using a solution mixture of 49% hydrofluoric acid, 30% hydrogen peroxide, and water. At this time, single-crystal Si functioned as an etching stopper, so porous Si was selectively etched. This substrate can be used again in the anodizing process as a substrate used to form a first substrate, or in the bonding process as a second substrate.

Before the substrate is reused to form a first substrate, annealing may be performed in hydrogen at 1,100° C. for 1 hr to recover surface roughness (microroughness) due to micropores. However, when the substrate is to be reused to form a first substrate, microroughness planarization is not always necessary because the surface is planarized simultaneously with sealing pores on the surface of the porous Si layer during prebaking in hydrogen at the early stage of epitaxial growth.

Instead of annealing in hydrogen, the microroughness due to micropores may be planarized by surface touch polishing.

EXAMPLE 11

Example 11 is a modification to Example 10. More specifically, the anodizing conditions for forming the first and second porous layers were changed as follows.
<Anodizing Conditions for Forming First Porous Layer>
  Current density: 7 (mA·cm$^{-2}$)
  First electrolyte: HF:H$_2$O:C$_2$H$_5$OH=1:1:1
  Second electrolyte: HF:H$_2$O:C$_2$H$_5$OH=0.5:67:33
  Process time: 11 (min)
  Porous Si thickness (target): 12 (µm)
  Material of Conductive Partition: Si
<Anodizing Conditions for Forming Second Porous Layer>
  Current density: 30 (mA·cm$^{-2}$)
  First electrolyte: HF:H$_2$O:C$_2$H$_5$OH=1:1:1
  Second electrolyte: HF:H$_2$O:C$_2$H$_5$OH=0.5:67:33
  Process time: 3 (min)
  Porous Si thickness (target): 3 (µm)
  Material of Conductive Partition: Si Under these anodizing conditions, 100 Si substrates were processed without exchanging a conductive partition 108. No porous layer was formed on the conductive partition 108, and the surface was electroetched (electropolished). Hence, no particles were generated from the conductive partition. When the 100 Si substrates were processed, the conductive partition 108 was thinned down by about 169 µm by electroetching.

EXAMPLE 12

Example 12 is another modification to Example 10. More specifically, the manufacturing conditions of Example 10 were changed as follows.
 1) Thickness of the epitaxial Si layer: 2 µm
 2) Thickness of the thermal oxide film on the surface of the epitaxial Si layer: 0.1 µm
 3) Second substrate: Si substrate having a 1.9-µm thick SiO$_2$ layer
 4) Bonding process: after the surfaces of first and second substrates were exposed to a nitrogen plasma, the two substrates were brought into tight contact with each other and annealed at 400° C. for 10 hrs.

EXAMPLE 13

Example 13 is anther modification to Example 10. More specifically, the manufacturing conditions of Example 10 were changed as follows.
 1) Second substrate: quartz substrate
 2) Bonding process: after the surfaces of first and second substrates were exposed to a nitrogen plasma, the two substrates were brought into tight contact with each other and annealed at 200° C. for 24 hrs.
 3) Annealing in hydrogen: annealing was further performed in hydrogen at 970° C. for 2 hrs. (When the surface roughness was evaluated with an atomic force microscope, the root-mean-square roughness in a 50-µm square area was approximately 0.2 nm. This nearly equals that of a commercially available normal Si wafer).
 4) Reuse: the structure on the first substrate side after separation was used in the anodizing process as a substrate used to form a first substrate.

EXAMPLE 14

A single-crystal Si substrate 11 was set in one of the above anodizing apparatuses, and porous layers 12a and 12b having a two-layered structure were formed by changing the current density. The anodizing conditions for forming the first and second porous layers were as follows.
<Anodizing Conditions for Forming First Porous Layer>
  Current density: 7 (mA·cm$^{-2}$)
  First electrolyte: HF:H$_2$O:C$_2$H$_5$OH=1:1:1
  Second electrolyte: HF:H$_2$O:C$_2$H$_5$OH=0.5:67:33
  Process time: 5 (min)
  Porous Si thickness (target): 6 (µm)
  Material of Conductive Partition: Si
<Anodizing Conditions for Forming Second Porous Layer>
  Current density: 30 (mA·cm$^{-2}$)
  First electrolyte: HF:H$_2$O:C$_2$H$_5$OH=1:1:1
  Second electrolyte: HF:H$_2$O:C$_2$H$_5$OH=0.5:67:33
  Process time: 110 (sec)
  Porous Si thickness (target): 3 (µm)
  Material of Conductive Partition: Si Under these anodizing conditions, 100 Si substrates were processed without exchanging a conductive partition 108. No porous layer was formed on the conductive partition 108, and the surface was electroetched (electropolished). Hence, no particles were generated from the conductive partition. When the 100 Si substrates were processed, the conductive partition 108 was thinned down by about 169 µm by electroetching.

The substrate having the porous structure was oxidized in an oxygen atmosphere at 400° C. for 1 hr. With this oxidation, the inner surface of each pore in the porous Si was covered with a thermal oxide film.

A 1-µm thick single-crystal GaAs layer 13 was epitaxially grown on the porous Si layer 12a by MOCVD (Metal Organic Chemical Vapor Deposition) (FIG. 2B). The growth conditions were as follows.

<Epitaxial Growth Conditions>

Source gas: TMG/AsH$_5$/H$_2$

Gas pressure: 80 (Torr)

Temperature: 700 (° C.)

The surface of the GaAs layer 13 and that of an independently prepared Si substrate (second substrate) 20 were brought into tight contact with each other to prepare a bonded substrate stack 30 (FIG. 2C).

A water jet having a diameter of 0.2 mm was ejected to the gap at the beveling of the bonded substrate stack 30, thereby separating the bonded substrate stack 30 into two substrates at the second porous layer 12$b$ (FIG. 2D).

A porous Si layer 12$b''$ remaining on the second substrate side was etched at 110° C. using a solution mixture (etchant) of etylenediamine/pyrocatechol/water (mixing ratio was 17 ml:3 g:8 ml). The single-crystal GaAs layer 13 functioned as an etching stopper, so the porous Si layers 12$a$ and 12$b''$ were selectively etched.

The etching rate for single-crystal GaAs by this etchant is very low. The etching amount (about several ten Å) of the single-crystal GaAs 13 can be neglected in practical use.

With the above process, a substrate having the 1-$\mu$m thick single-crystal GaAs layer 13 on the single-crystal Si substrate 20 was obtained. When the film thickness of the single-crystal GaAs layer of this substrate was measured at 100 points on the entire surface, the film thickness uniformity was 1 $\mu$m±29.8 nm.

Sectional observation with a transmission electron microscope revealed no new crystal defects in the GaAs layer, indicating that satisfactory crystallinity was maintained.

When an Si substrate having an oxide film was used as a support substrate, a substrate having a GaAs layer on the insulating film could be formed.

Porous Si remaining on the first substrate side was also selectively etched using a solution mixture of 49% hydrofluoric acid, 30% hydrogen peroxide, and water while stirring the solution. At this time, single-crystal Si functioned as an etching stopper, so porous Si was selectively etched. This substrate can be used again in the anodizing process as a substrate used to form a first substrate, or in the bonding process as a second substrate.

Before the substrate is reused to form a first substrate, annealing may be performed in hydrogen at 1,100° C. for 1 hr to recover surface roughness (microroughness) due to micropores. However, when the substrate is to be reused to form a first substrate, microroughness planarization is not always necessary because the surface is planarized simultaneously with sealing pores on the surface of the porous Si layer during prebaking in hydrogen at the early stage of epitaxial growth.

Instead of annealing in hydrogen, the microroughness due to micropores may be planarized by surface touch polishing.

EXAMPLE 15

A single-crystal Si substrate 11 was set in one of the above anodizing apparatuses, and porous layers 12$a$ and 12$b$ having a two-layered structure were formed by changing the current density (FIG. 2A). The anodizing conditions for forming the first and second porous layers were as follows.

<Anodizing Conditions for Forming First Porous Layer>

Current density: 7 (mA·cm$^{-2}$)

First electrolyte: HF:H$_2$O:C$_2$H$_5$OH=1:1:1

Second electrolyte: HF:H$_2$O:C$_2$H$_5$OH=0.5:67:33

Process time: 11 (min)

Porous Si thickness (target): 12 ($\mu$m)

Material of Conductive Partition: Si

<Anodizing Conditions for Forming Second Porous Layer>

Current density: 20 (mA·cm$^{-2}$)

First electrolyte: HF:H$_2$O:C$_2$H$_5$OH=1:1:1

Second electrolyte: HF:H$_2$O:C$_2$H$_5$OH=0.5:67:33

Process time: 3 (min)

Porous Si thickness (target): 3 ($\mu$m)

Material of Conductive Partition: Si

Under these anodizing conditions, 100 Si substrates were processed without exchanging a conductive partition 108. No porous layer was formed on the conductive partition 108, and the surface was electroetched (electropolished). Hence, no particles were generated from the conductive partition. When the 100 Si substrates were processed, the conductive partition 108 was thinned down by about 258 $\mu$m by electroetching.

The above result remained unchanged in either a case wherein the porous layers were formed by continuously forming first and second porous layers on each of 100 Si substrates or a case wherein first porous layers were formed on 100 Si substrates, and then second porous layers were formed on the 100 Si substrates.

The substrate having the porous structure was oxidized in an oxygen atmosphere at 400° C. for 1 hr. With this oxidation, the inner surface of each pore in the porous Si layer was covered with a thermal oxide film.

A 1-$\mu$m thick single-crystal InP layer 13 was epitaxially grown on the porous Si layer by MOCVD (Metal Organic Chemical Vapor Deposition) (FIG. 2B).

The surface of the InP layer 13 and that of an independently prepared quartz substrate (second substrate) 20 were exposed to a nitrogen plasma, brought into tight contact with each other, and then annealed at 200° C. for 10 hrs to prepare a bonded substrate stack 30 (FIG. 2C).

A water jet having a diameter of 0.2 mm was ejected to the gap at the beveling of the bonded substrate stack 30, thereby separating the bonded substrate stack 30 into two substrates at the second porous layer 12$b$ (FIG. 2D).

A porous Si layer remaining on the second substrate side was selectively etched using a solution mixture of 49% hydrofluoric acid, 30% hydrogen peroxide, and water while stirring the solution (FIG. 2E). The single-crystal InP layer 13 functioned as an etching stopper, so the porous Si layers 12$a$ and 12$b''$ were selectively etched.

The etching rate for single-crystal InP by this etchant is very low. The etching amount (about several ten Å) of the single-crystal InP layer 13 can be neglected in practical use.

With the above process, a substrate having the 1-$\mu$m thick single-crystal InP layer 13 on the quartz substrate 20 was obtained. When the film thickness of the single-crystal InP layer of this substrate was measured at 100 points on the entire surface, the film thickness uniformity was 1 $\mu$m±29.0 nm.

Sectional observation with a transmission electron microscope revealed no new crystal defects in the InP layer, indicating that satisfactory crystallinity was maintained.

Porous Si remaining on the first substrate side was also selectively etched using a solution mixture of 49% hydrofluoric acid, 30% hydrogen peroxide, and water while stirring the solution. At this time, single-crystal Si functioned as an etching stopper, so porous Si was selectively etched. This substrate can be used again in the anodizing process as a substrate used to form a first substrate, or in the bonding process as a second substrate.

Before the substrate is reused to form a first substrate, annealing maybe performed in hydrogen at 1,100° C. for 1 hr to recover surface roughness (microroughness) due to micropores. However, when the substrate is to be reused to form a first substrate, microroughness planarization is not always necessary because the surface is planarized simultaneously with sealing pores on the surface of the porous Si layer during prebaking in hydrogen at the early stage of epitaxial growth.

Instead of annealing in hydrogen, the microroughness due to micropores may be planarized by surface touch polishing.

EXAMPLE 16

In Example 16, the method of separating a bonded substrate stack in Examples 10 to 15 was changed. More specifically, instead of using a water jet, in Example 16, a thin wedge made of a resin was inserted into the gap at the beveling of a bonded substrate stack, thereby separating a bonded substrate stack 30 into two substrates at a second (lower) porous layer 12b.

EXAMPLE 17

In Example 17, both surfaces of a single-crystal Si substrate constructing a first substrate were subjected to each of the processes described in Examples 10 to 15.

EXAMPLE 18

A single-crystal Si substrate was set in one of the above anodizing apparatuses, and a porous layer having a four-layered structure was formed by changing the first electrolyte and current density. The anodizing conditions for forming the first to fourth porous layers were as follows.
<Anodizing Conditions for Forming First Porous Layer>
  Current density: 7 (mA·cm$^{-2}$)
  First electrolyte: HF:H$_2$O:C$_2$H$_5$OH=1:1:1
  Second electrolyte: HF:H$_2$O:C$_2$H$_5$OH=0.5:67:33
  Process time: 5 (min)
  Porous Si thickness (target): 6 ($\mu$m)
  Material of Conductive Partition: Si
<Anodizing Conditions for Forming Second Porous Layer>
  Current density: 10 (mA·cm$^{-2}$)
  First electrolyte: HF:H$_2$O:C$_2$H$_5$OH=1:2:2
  Second electrolyte: HF:H$_2$O:C$_2$H$_5$OH=0.5:67:33
  Process time: 3 (min)
  Porous Si thickness (target): 3 ($\mu$m)
  Material of Conductive Partition: Si
<Anodizing Conditions for Forming Third Porous Layer>
  Current density: 7 (mA·cm$^{-2}$)
  First electrolyte: HF:H$_2$O:C$_2$H$_5$OH=1:1:1
  Second electrolyte: HF:H$_2$O:C$_2$H$_5$OH=0.5:67:33
  Process time: 5 (min)
  Porous Si thickness (target): 6 ($\mu$m)
  Material of Conductive Partition: Si
<Anodizing Conditions for Forming Fourth Porous Layer>
  Current density: 20 (mA·cm$^{-2}$)
  First electrolyte: HF:H$_2$O:C$_2$H$_5$OH=1:2:2
  Second electrolyte: HF:H$_2$O:C$_2$H$_5$OH=0.5:67:33
  Process time: 80 (sec)
  Porous Si thickness (target): 1 ($\mu$m)
  Material of Conductive Partition: Si Under these anodizing conditions, 100 Si substrates were processed without exchanging a conductive partition 108. No porous layer was formed on the conductive partition 108, and the surface was electroetched (electropolished) Hence, no particles were generated from the conductive partition. When the 100 Si substrates were processed, the conductive partition 108 was thinned down by about 208$\mu$m by electroetching.

The above result remained unchanged in either a case wherein the porous layers were formed by continuously forming first to fourth porous layers on each of 100 Si substrates or a case wherein first porous layers were formed on 100 Si substrates, second porous layers were formed on the 100 Si substrates, third porous layers were formed on the Si substrates, and finally fourth porous layers were formed on the Si substrates.

To form a porous layer having a multilayered structure on a single-crystal Si substrate while changing a first electrolyte 131, for example, one anodizing apparatus is used, and the first electrolyte 131 that fills the space between a cathode 104 and the single-crystal Si substrate to be processed is replaced as needed. Alternatively, a plurality of anodizing apparatuses are used, and the Si substrate to be processed is transferred to a corresponding anodizing tank.

EXAMPLE 19

A single-crystal Si substrate was set in one of the above anodizing apparatuses, and a porous layer having a four-layered structure was formed by executing anodizing in three steps while changing the current density. The anodizing conditions for the first to third steps of forming the porous layers were as follows.
<Anodizing Conditions for First Step>
  Current density: 1 (mA·cm$^{-2}$)
  First electrolyte: HF:H$_2$O:C$_2$H$_5$OH=1:1:2
  Second electrolyte: HF:H$_2$O:C$_2$H$_5$OH=0.5:67:33
  Process time: 8 (min)
  Porous Si thickness (target): 10 ($\mu$m)
  Material of Conductive Partition: Si
<Anodizing Conditions for Second Step>
  Current density: 7 (mA·cm$^{-2}$)
  First electrolyte: HF:H$_2$O:C$_2$H$_5$OH=1:1:2
  Second electrolyte: HF:H$_2$O:C$_2$H$_5$OH=0.5:67:33
  Process time: 8 (min)
  Porous Si thickness (target): 10 ($\mu$m)
  Material of Conductive Partition: Si
<Anodizing Conditions for Third Step>
  Current density: 100 (mA·cm$^{-2}$)
  First electrolyte: HF:H$_2$O:C$_2$H$_5$OH=1:1:2
  Second electrolyte: HF:H$_2$O:C$_2$H$_5$OH=0.5:67:33
  Process time: 4 (sec)
  Material of Conductive Partition: Si According to this process, a porous layer having a two-layered structure of a first layer (upper layer) and second layer (lower layer), both of which had a thickness of about 10 $\mu$m, was formed by anodizing of the first and second steps. A new layer having a thickness of 1 $\mu$m or less was formed in the second layer by anodizing of the third step. Hence, a porous layer having a total of four layers was formed on the single-crystal Si substrate.

EXAMPLE 20

A single-crystal Si substrate was set in one of the above anodizing apparatuses, and porous layers 12a and 12b having a two-layered structure were formed by changing the current density (FIG. 2A). The anodizing conditions for forming the first and second porous layers were as follows.

<Anodizing Conditions for Forming First Porous Layer>
  Current density: 8.15 (mA·cm$^{-2}$)
  First electrolyte:
    HF:H$_2$O:C$_2$H$_5$OH=17:21:13
    (HF=35.6 wt %, C$_2$H$_5$OH=18.6 wt %)
  Second electrolyte: HF (1 wt %, 1.5 wt %, or 2.0 wt %)
  Process time: 5 (min)
  Porous Si thickness (target): 6 ($\mu$m)
  Material of Conductive Partition: Si
    (Specific resistance=0.01Ω~0.02Ω)
<Anodizing Conditions for Forming Second Porous Layer>
  Current density: 30.6 (mA·cm$^{-2}$)
  First electrolyte:
    HF:H$_2$O:C$_2$H$_5$OH=17:21:13
    (HF=35.6 wt %, C$_2$H$_5$OH=18.6 wt %)
  Second electrolyte: HF (1 wt %, 1.5 wt %, or 2.0 wt %)
  Process time: 80 (sec)
  Porous Si thickness (target): 3 ($\mu$m)
  Material of Conductive Partition: Si
    (Specific resistance=0.01Ω~0.02Ω)

Under these three anodizing conditions (HF=1 wt %, 1.5 wt %, or 2.0 wt %), Si substrates are processed without exchanging the conductive partition 108.

With the HF density of 1 wt % and 1.5 wt % for the second electrolyte, it is confirmed by observing with an electron microscope that no porous layer was formed on the conductive partition 108, and the surface was electroetched (electropolished). Hence, no particles were generated from the conductive partition. When the 5 Si substrates were processed, the conductive partition 108 was thinned down by about 1 $\mu$m by electroetching. Thus, it is possible to improve throughput while preventing decay of the conductive partition 108 and reducing process time by adopting the foregoing anodizing conditions.

In contrast, with the HF density of 2 wt % for the second electrolyte, it is observed that a porous layer was formed on the conductive partition 108 when forming the first porous layer on the Si substrate, and the conductive partition 108 is decayed when forming the second porous layer on the Si substrate.

The above result remained unchanged in either a case wherein the porous layers were formed by continuously forming first and second porous layers on each of 5 Si substrates or a case wherein first porous layers were formed on 5 Si substrates, and then second porous layers were formed on the 5 Si substrates.

The substrate having the porous structure was oxidized in an oxygen atmosphere at 400° C. for 1 hr. With this oxidation, the inner surface of each pore in the porous layers 12a and 12b was covered with a thermal oxide film.

A 0.3-$\mu$m thick single-crystal Si layer 13 was epitaxially grown on the porous Si layer by CVD (Chemical Vapor Deposition) (FIG. 2B). The growth conditions were as follows. Since the surface of the porous Si layer was exposed to H at the early stage of epitaxial growth, the pores on the surface were filled to form a flat surface.

<Epitaxial Growth Conditions>
  Source gas: SiH$_2$Cl$_2$/H$_2$
  Gas flow rate: 0.5/180 (1/min)
  Gas pressure: 80 (Torr)
  Temperature: 950 (° C.)
  Growth rate: 0.3 ($\mu$m/min)

A 200-nm thick SiO$_2$ layer 14 was formed on the surface of the epitaxially grown single-crystal Si layer 13 by thermal oxidation (FIG. 2B).

The surface of this SiO$_2$ layer and that of an independently prepared Si substrate (second substrate) 20 were brought into tight contact with each other and then bonded by annealing at 1,100° C. for 1 hr to prepare a bonded substrate stack 30 (FIG. 2C). This annealing can be performed in N$_2$, an inert gas atmosphere, or an oxidation atmosphere, or a combination thereof.

The bonded substrate stack 30 was processed from the back surface side of the first substrate 10 by grinding, polishing, or etching until the porous Si layer 12b was exposed (FIG. 2D).

The porous Si layers 12a and 12b" remaining on the bonded substrate stack 30 were etched using a solution mixture of 49% hydrofluoric acid, 30% hydrogen peroxide, and water (FIG. 2E) The single-crystal Si layer 13 functioned as an etching stopper, so the porous Si layer was selectively etched.

Since the etching rate for non-porous single-crystal Si by this etchant is very low, the selectivity ratio of porous single-crystal Si to non-porous single-crystal Si reaches 10$^5$ or more. Hence, the etching amount (about several ten Å) of the non-porous layer can be neglected in practical use.

With the above process, an SOI substrate (FIG. 2E) having the 0.2-$\mu$m thick single-crystal Si layer 13 on the Si oxide film 14 was obtained. When the film thickness of the single-crystal Si layer of this SOI substrate was measured at 100 points on the entire surface, the film thickness uniformity was 201 nm±4 nm.

In addition, annealing was performed in hydrogen at 1,100° C. for 1 hr. The surface roughness was evaluated with an atomic force microscope. The root-mean-square roughness in a 50-$\mu$m square area was approximately 0.2 nm. This nearly equals that of a commercially available normal Si wafer.

Sectional observation with a transmission electron microscope revealed no new crystal defects in the Si layer, indicating that satisfactory crystallinity was maintained.

The same result as described above was obtained even when no oxide film was formed on the surface of the epitaxially grown single-crystal Si layer.

OTHERS

In the above examples, for the process of epitaxially growing a non-porous layer such as a single-crystal Si layer on a porous Si layer, not only CVD but also, e.g., MBE, sputtering, or liquid phase growth can be employed.

The etchant used to selectively etch the porous Si layer is not limited to a solution mixture of 49% hydrofluoric acid, 30% hydrogen peroxide, and water. For example, the following etchants may be employed.

1) a solution mixture of hydrofluoric acid and water
2) a solution mixture prepared by adding at least one of an alcohol and hydrogen peroxide to a solution mixture of hydrofluoric acid and water
3) buffered hydrofluoric acid
4) a solution mixture prepared by adding at least one of an alcohol and hydrogen peroxide to buffered hydrofluoric acid
5) a solution mixture of hydrofluoric acid, nitric acid, and acetic acid Since porous Si has a large surface area, it can be selectively etched by various etchants, as described above.

To separate the bonded substrate stack, not only the separation method using the water jet method but also a method of applying a force (e.g., press force or tensile force) to the bonded substrate stack in a direction perpendicular to the surface of the bonded substrate stack, a method of applying external pressure such as a shearing force to the bonded substrate stack in the planar direction, a method of expanding the porous Si layer by oxidizing it from the peripheral portion to generate internal pressure in the porous Si layer, a method of applying pulsed heat to the bonded substrate stack to apply thermal stress to the porous layer, a method of softening the porous layer, a method of inserting a wedge between the two substrates of the bonded substrate stack, or any other method can be employed.

The first electrolyte filling the space between the cathode 104 and the substrate to be processed is not limited to the above examples. Another electrolyte containing different ions or having a different concentration may be employed. As the second electrolyte 141 filling the space between the conductive partition 108 and the substrate to be processed, an electrolyte prepared by mixing HF, $H_2O$, and $C_2H_5OH$ at a ratio of 0.5:67:33 was used in the above examples. However, the ratio can be changed to, e.g., 1:67:33, 0.3:67:33, 1:100:0, or 0.5:50:50. As the second electrolyte 141, for example, a KOH solution can also be preferably used.

The remaining processes are not limited to the above examples, either, and various methods can be employed.

The above idea in which electrolytes having different properties are used as the first and second electrolytes from the viewpoint of the anodizing reaction can also be applied to use of an anodizing apparatus having no conductive partition. For example, an electrolyte capable of forming a porous structure on the surface of the substrate to be processed can be used as the first electrolyte, and an electrolyte that prevents contamination substances from dissolving from the anode or an electrolyte that prevents generation of particles from the anode can be used as the second electrolyte.

According to the present invention, generation of particles from, e.g., a conductive partition can be prevented.

As many apparently widely different embodiments of the present invention can be made without departing from the spirit and scope thereof, it is to be understood that the invention is not limited to the specific embodiments thereof except as defined in the appended claims.

What is claimed is:

1. A processing method of using an anodizing apparatus in which a conductive partition is inserted between a cathode and an anode and electrically connected to said anode, placing a substrate between said cathode and said conductive partition, and forming a porous layer on the substrate by an anodizing reaction, comprising:

the preparation step of bringing said cathode and a substrate to be processed into electrical contact with each other through a first electrolyte and bringing said conductive partition and the substrate into electrical contact with each other through a second electrolyte; and the anodizing step of flowing a current between said cathode and said anode to form a porous layer on a surface of the substrate on said cathode side, wherein an electrolyte capable of forming a porous structure on the substrate is used as the first electrolyte, and an electrolyte substantially incapable of forming a porous structure on said conductive partition is used as the second electrolyte.

2. The method according to claim 1, wherein an electrolyte capable of electroetching said conductive partition is used as the second electrolyte.

3. The method according to claim 1, wherein said conductive partition is formed from the same material as that of the substrate to be processed.

4. The method according to claim 1, wherein said conductive partition is essentially formed from an Si material.

5. The method according to claim 1, wherein the first electrolyte and the second electrolyte are solutions containing hydrogen fluoride.

6. The method according to claim 5, wherein the first electrolyte and the second electrolyte contain hydrogen fluoride at different concentrations.

7. The method according to claim 6, wherein the first electrolyte contains hydrogen fluoride at a concentration higher than that in the second electrolyte.

8. The method according to claim 7, wherein the first electrolyte contains hydrogen fluoride at a concentration of 10% to 50%.

9. The method according to claim 7, wherein the second electrolyte contains hydrogen fluoride at a concentration of not more than 10%.

10. The method according to claim 7, wherein the second electrolyte contains hydrogen fluoride at a concentration of not more than 2%.

11. The method according to claim 1, wherein the current supplied from said anode to the substrate is supplied through said conductive partition.

12. The method according to claim 1, wherein the anodizing step comprises forming, on the substrate, a porous layer having a multilayered structure formed from at least two layers having different porosities.

13. The method according to claim 12, wherein the anodizing step comprises changing the magnitude of the current flowed between said cathode and said anode to form the porous layer having the multilayered structure.

14. The method according to claim 12, wherein the anodizing step comprises replacing the first electrolyte with another electrolyte to form the porous layer having the multilayered structure.

15. The method according to claim 12, wherein the anodizing step comprises forming the porous layer having the multilayered structure such that all or some layers from a second layer counted from a surface of the substrate have porosities higher than a porosity of a first layer counted from the surface of the substrate.

16. The method according to claim 15, wherein the anodizing step comprises setting the porosity of the first layer at not more than 30% and the porosities of all or some layers from the second layer at not less than 30%.

17. The method according to claim 15, wherein the anodizing step comprises setting a thickness of the second layer at not more than 5 $\mu$m.

18. The method according to claim 1, wherein the preparation step comprises the steps of holding the substrate to be processed between said cathode and said anode by a substrate holder, and filling the space between said cathode and the substrate with the first electrolyte and filling the space between said conductive partition and the substrate with the second electrolyte.

19. The method according to claim 18, further comprising, after the porous layer is formed on the substrate to be processed, the steps of discharging the first and second electrolytes, and detaching the substrate from said substrate holder.

20. The method according to claim 1, further comprising the cleaning and/or rinsing step of cleaning and/or rinsing the substrate after the porous layer is formed on the substrate to be processed.

21. The method according to claim 20, further comprising the drying step of drying the substrate cleaned and/or rinsed in the cleaning and/or rinsing step.

22. A substrate manufacturing method comprising:

the first formation step of forming a porous layer on a surface of a substrate according to the processing method of claim 1;

the second formation step of forming a non-porous layer on the porous layer;

the bonding step of, using a substrate obtained in the second formation step as a first substrate, bonding the first substrate to an independently prepared second substrate via the non-porous layer to prepare a bonded substrate stack; and the removal step of removing a portion from a back surface of the first substrate to the porous layer from the bonded substrate stack.

23. A method of manufacturing a semiconductor thin film, comprising:

the first formation step of forming a porous layer on a surface of a substrate according to the processing method of claim 1;

the second formation step of forming a semiconductor thin film on the porous layer; and the separation step of separating a substrate obtained in the second formation step at the porous layer.

24. The method according to claim 23, wherein the separation step comprises bonding a film to the semiconductor thin film of the substrate obtained in the second formation step and removing the film to separate the substrate at the porous layer.

25. A substrate manufacturing method comprising:

the first formation step of forming a porous layer on a surface of a substrate according to the processing method of claim 1;

the second formation step of forming a non-porous layer on the porous layer;

the bonding step of, using a substrate obtained in the second formation step as a first substrate, bonding the first substrate to an independently prepared second substrate via the non-porous layer to prepare a bonded substrate stack;

the separation step of separating the bonded substrate stack at the porous layer; and the removal step of removing the porous layer remaining on the second substrate after separation.

26. The method according to claim 25, wherein the separation step comprises injecting a fluid into the porous layer to separate the bonded substrate stack into two substrates.

27. The method according to claim 26, wherein a gas is used as the fluid.

28. The method according to claim 26, wherein a liquid is used as the fluid.

29. The method according to claim 25, wherein the separation step comprises applying a force to the bonded substrate stack in a direction substantially perpendicular to a surface of the bonded substrate stack to separate the bonded substrate stack into two substrates.

30. The method according to claim 25, wherein the separation step comprises shearing stress to the bonded substrate stack in a planar direction to separate the bonded substrate stack into two substrates.

31. The method according to claim 25, wherein the separation step comprises oxidizing a peripheral portion of the porous layer of the bonded substrate stack to increase a volume, thereby separating the bonded substrate stack into two substrates.

32. The method according to claim 25, further comprising removing the porous layer remaining on a surface of the first substrate after separation to enable reuse of the substrate.

33. The method according to claim 25, wherein the first formation step comprises forming a porous layer having a multilayered structure with different porosities.

34. The method according to claim 33, wherein the separation step comprises using, as a separation layer, an inner layer of the porous layer having the multilayered structure.

35. The method according to claim 25, wherein the first formation step comprises forming the porous layer on a surface of an Si substrate.

36. The method according to claim 25, wherein the non-porous layer comprises a semiconductor layer.

37. The method,according to claim 25, wherein the non-porous layer comprises a single-crystal Si layer.

38. The method according to claim 25, wherein the non-porous layer comprises a single-crystal Si layer and an insulating layer sequentially from an inside.

39. The method according to claim 38, wherein the insulating layer is an $SiO_2$ layer.

40. The method according to claim 25, wherein the non-porous layer comprises a compound semiconductor layer.

41. The method according to claim 40, wherein the removal step comprises selectively etching the porous layer using an etchant whose etching rate is higher for the porous layer than for a compound semiconductor.

42. The method according to claim 25, wherein the second substrate is an Si substrate.

43. The method according to claim 25, wherein the second substrate is an Si substrate having an oxide film on a surface.

44. The method according to claim 25, wherein the second substrate is a transparent substrate.

45. The method according to claim 25, wherein the second substrate is an insulating substrate.

46. The method according to claim 25, wherein the second substrate is a quartz substrate.

47. The method according to claim 25, further comprises, after the removal step, the planarization step of planarizing the second substrate after separation.

48. The method according to claim 47, wherein the planarization step comprises performing annealing in an atmosphere containing hydrogen.

49. The method according to claim 25, wherein the removal step comprises selectively etching the porous layer using, as an etchant, a solution selected from the group consisting of
   a) hydrofluoric acid,
   b) a solution mixture prepared by adding at least one of an alcohol and hydrogen peroxide to hydrofluoric acid,
   c) buffered hydrofluoric acid, and
   d) a solution mixture prepared by adding at least one of an alcohol and hydrogen peroxide to buffered hydrofluoric acid.

50. The method according to claim 25, wherein the removal step comprises selectively polishing the porous layer using the non-porous layer as a stopper.

51. The method according to claim 25, wherein the bonding step comprises bringing the first substrate having the non-porous layer into tight contact with the second substrate.

52. The method according to claim 25, wherein the bonding step comprises bringing the first substrate having the non-porous layer into tight contact with the second substrate and then performing a process selected from the group consisting of anodic bonding, pressing, annealing, and a combination thereof.

53. A processing method of placing a substrate to be processed between a cathode and an anode of an anodizing tank having said cathode and said anode, which is partitioned by the substrate to be processed into a space on said cathode side and a space on said anode side, and forming a porous layer on the substrate by an anodizing reaction, comprising the steps of:

filling the space on said cathode side of said anodizing tank with a first electrolyte and filling the space on said anode side with a second electrolyte; and flowing a current between said cathode and said anode to form the porous layer on a surface of the substrate on said cathode side, wherein the first electrolyte and the second electrolyte are electrolytes having different properties from the viewpoint of the anodizing reaction.

54. The method according to claim 53, wherein said anodizing tank has a conductive partition for isolating the substrate to be processed from said anode.

* * * * *

UNITED STATES PATENT AND TRADEMARK OFFICE
CERTIFICATE OF CORRECTION

PATENT NO. : 6,417,069 B1
DATED : July 9, 2002
INVENTOR(S) : Kiyofumi Sakaguchi et al.

It is certified that error appears in the above-identified patent and that said Letters Patent is hereby corrected as shown below:

<u>Column 5,</u>
Line 30, "material" should read -- material. --.

<u>Column 11,</u>
Line 38, "etching," should read -- etching. --; and
Line 56, "processes" should read -- processes, --.

<u>Column 13,</u>
Line 39, "etching," should read -- etching. --.

<u>Column 14,</u>
Line 53, "electrolyte." should read -- electrolyte --.

<u>Column 18,</u>
Line 35, "filing" should read -- filling --; and
Line 51, "(electropolished)" should read -- (electropolished). --.

<u>Column 20,</u>
Line 30, "(electropolished)" should read -- (electropolished). --.

<u>Column 21,</u>
Line 38, "the" (third occurrence) should read -- of the --; and
Line 49, "anther" should read -- another --.

<u>Column 22,</u>
Line 13, "(electropolished)" should read -- (electropolished). --; and
Line 27, "$AsH_5/H_2$" should read -- $AsH_3/H_2$ --.

<u>Column 25,</u>
Line 14, "hydrof-" should read -- hydro- --; and
Line 15, "luoric" should read -- fluoric --.

<u>Column 26,</u>
Line 9, "anther" should read -- another --.

<u>Column 27,</u>
Line 3, "$AsH_5/H_2$" should read -- $AsH_3/H_2$ --.

UNITED STATES PATENT AND TRADEMARK OFFICE
CERTIFICATE OF CORRECTION

PATENT NO. : 6,417,069 B1
DATED : July 9, 2002
INVENTOR(S) : Kiyofumi Sakaguchi et al.

It is certified that error appears in the above-identified patent and that said Letters Patent is hereby corrected as shown below:

Column 38,
Line 67, "maybe" should read -- may be --.

Column 30,
Line 1, "(electropolished)" should read -- (electropolished). --.

Column 31,
Line 56, "H" should read -- $H_2$ --.

Column 32,
Line 15, "(Fig. 2E)" should read -- (Fig. 2E). --; and
Line 61, "acid Since" should read -- acid. ¶Since --.

Column 34,
Line 48, "of" should read -- of: --;
Line 50, "holder, and" should read -- holder; and --;
Line 57, "of" should read -- of: --; and
Line 58, "electrolytes, and" should read -- electrolytes; and --.

Column 36,
Line 15, "method, according" should read -- method according --;
Line 48, "of" should read -- of: --; and
Line 52, "acid, and" should read -- acid; and --.

Signed and Sealed this

Twenty-eighth Day of January, 2003

JAMES E. ROGAN
*Director of the United States Patent and Trademark Office*